(12) United States Patent
Eroz et al.

(10) Patent No.: US 6,829,308 B2
(45) Date of Patent: Dec. 7, 2004

(54) SATELLITE COMMUNICATION SYSTEM UTILIZING LOW DENSITY PARITY CHECK CODES

(75) Inventors: Mustafa Eroz, Germantown, MD (US); Feng-Wen Sun, Germantown, MD (US); Lin-Nan Lee, Potomac, MD (US); Dan Fraley, Potomac, MD (US)

(73) Assignee: Hughes Electronics Corporation, El Segundo, CA (US)

( * ) Notice: Subject to any disclaimer, the term of this patent is extended or adjusted under 35 U.S.C. 154(b) by 92 days.

(21) Appl. No.: 10/353,224

(22) Filed: Jan. 28, 2003

(65) Prior Publication Data

US 2004/0028002 A1 Feb. 12, 2004

Related U.S. Application Data

(60) Provisional application No. 60/398,760, filed on Jul. 26, 2002, provisional application No. 60/403,812, filed on Aug. 15, 2002, provisional application No. 60/421,505, filed on Oct. 25, 2002, provisional application No. 60/421,999, filed on Oct. 29, 2002, provisional application No. 60/423,710, filed on Nov. 4, 2002, provisional application No. 60/393,457, filed on Jul. 3, 2002, and provisional application No. 60/440,199, filed on Jan. 15, 2003.

(51) Int. Cl.[7] .............................. H03K 7/06; H03K 9/06
(52) U.S. Cl. ........................... 375/271; 714/6; 714/763; 708/530
(58) Field of Search ................................ 714/799, 786; 375/271

(56) References Cited

U.S. PATENT DOCUMENTS

| | | | | |
|---|---|---|---|---|
| 6,097,703 A | * | 8/2000 | Larsen et al. ................ | 370/254 |
| 6,518,892 B2 | * | 2/2003 | Shen et al. .................... | 341/50 |
| 6,553,535 B1 | | 4/2003 | Asada et al. ................. | 714/777 |
| 6,665,361 B1 | * | 12/2003 | Christodoulides et al. .. | 375/364 |
| 2002/0042899 A1 | * | 4/2002 | Tzannes et al. ............. | 714/786 |
| 2002/0051501 A1 | * | 5/2002 | Demjanenko et al. ...... | 375/298 |
| 2002/0150167 A1 | * | 10/2002 | Demjanenko et al. ...... | 375/259 |
| 2002/0153938 A1 | * | 10/2002 | Baudelot et al. ............ | 327/430 |
| 2003/0023917 A1 | * | 1/2003 | Richardson et al. ........ | 714/749 |
| 2003/0033575 A1 | * | 2/2003 | Richardson et al. ........ | 714/799 |
| 2003/0037298 A1 | * | 2/2003 | Eleftheriou et al. ........ | 714/752 |
| 2003/0058958 A1 | | 3/2003 | Shokrollahi et al. ........ | 375/295 |
| 2003/0074626 A1 | * | 4/2003 | Coker et al. ................ | 714/752 |
| 2003/0104788 A1 | * | 6/2003 | Kim .......................... | 455/67.3 |
| 2003/0126551 A1 | * | 7/2003 | Mantha et al. .............. | 714/790 |
| 2004/0034828 A1 | * | 2/2004 | Hocevar ..................... | 714/800 |
| 2004/0064779 A1 | * | 4/2004 | Vasic et al. ................. | 714/758 |
| 2004/0093554 A1 | * | 5/2004 | Hung ......................... | 714/801 |

OTHER PUBLICATIONS

"Constellation labeling for linear encoders" Wesel, R.D.; Xueting Liu; Cioffi, J.M.; Komninakis, C.;☐☐Information Theory, IEEE Transactions on , vol.: 47 , Issue: 6 , Sep. 2001 pp.: 2417–2431.*

"Signal constellations for bit–interleaved coded modulation" Le Goff, S.Y.; Information Theory, IEEE Transactions on , vol.: 49 , Issue: 1 , Jan. 2003 pp.: 307–313.*

Sci–worx GmbH, "FEC_S2; Next Generation FEC for Digital Video Broadcasting via Satellite", www.sci–worx.com, 2003.

\* cited by examiner

Primary Examiner—Stephen Chin
Assistant Examiner—Harry Vartanian
(74) Attorney, Agent, or Firm—John T. Whelan

(57) ABSTRACT

An approach for reliably communicating over a satellite in support of a communication service including, for example, as direct broadcast satellite and data service, is disclosed. An input message is encoded, yielding a structured Low Density Parity Check (LDPC) coded message. The coded message is modulated according to a high order modulation scheme that has a signal constellation representing more than two symbols per signaling point—e.g., 8-PSK (Phase Shift Keying) and 16-QAM (Quadrature Amplitude Modulation). The system includes a transmitter configured to propagate the modulated signal over the satellite. The above approach is particularly applicable to bandwidth constrained communication systems requiring high data rates.

32 Claims, 17 Drawing Sheets

SATELLITE COMMUNICATION SYSTEM UTILIZING LOW DENSITY PARITY CHECK CODES

RELATED APPLICATIONS

This application is related to, and claims the benefit of the earlier filing date under 35 U.S.C. § 119(e) of, U.S. Provisional Patent Application (Ser. No. 60/398,760) filed Jul. 26, 2002, entitled "Code Design and Implementation Improvements for Low Density Parity Check Codes," U.S. Provisional Patent Application (Ser. No. 60/403,812) filed Aug. 15, 2002, entitled "Power and Bandwidth Efficient Modulation and Coding Scheme for Direct Broadcast Satellite and Broadcast Satellite Communications," U.S. Provisional Patent Application (Ser. No. 60/421,505), filed Oct. 25, 2002, entitled "Method and System for Generating Low Density Parity Check Codes," U.S. Provisional Patent Application (Ser. No. 60/421,999), filed Oct. 29, 2002, entitled "Satellite Communication System Utilizing Low Density Parity Check Codes" and U.S. Provisional Patent Application (Ser. No. 60/423,710), filed Nov. 4, 2002 entitled "Code Design and Implementation Improvements for Low Density Parity Check Codes"; the entireties of which are incorporated herein by reference. This application also is related to, and claims the benefit of the filing date under 35 U.S.C. §119(e) of, U.S. Provisional Patent Application (Ser. No. 60/393,457) filed Jul. 03, 2002, entitled "Code Design and Implementation Improvements for Low Density Parity Check Codes" and U.S. Provisional Patent Application (Ser. No. 60/440,199) filed Jan. 15, 2003, entitled "Novel Solution to Routing Problem in Low Density Pan Check Decoders."

FIELD OF THE INVENTION

The present invention relates to communication systems, and more particularly to a satellite communication system utilizing a linear block coding technique.

BACKGROUND OF THE INVENTION

Satellite communication systems have emerged as a viable solution for supporting broadband services. As such, power and bandwidth efficient modulation and coding are highly desirable for satellite communications systems to provide reliable communication across noisy communication channels. These communication channels exhibit a fixed capacity that can be expressed in terms of bits per second (bps) per Hz (bps/Hz) for a given signal-to-noise ratio, defining a theoretical upper limit (known as the Shannon limit). As a result, coding design has aimed to achieve rates approaching this Shannon limit. One such class of codes that approach the Shannon limit is Low Density Parity Check (LDPC) codes.

Traditionally, LDPC codes have not been widely deployed because of a number of drawbacks. One drawback is that the LDPC encoding technique is highly complex. Encoding an LDPC code using its generator matrix would require storing a very large, non-sparse matrix. Additionally, LDPC codes require large blocks to be effective; consequently, even though parity check matrices of LDPC codes are sparse, storing these matrices is problematic. From an implementation perspective, storage is an important reason why LDPC codes have not become widespread in practice. A key challenge in LDPC code implementation has been how to achieve the connection network between several processing engines (nodes) in the decoder.

The explosive growth of broadband services has been fueled by consumers' demands for greater and greater data rates to support, for example, their multi-media applications (e.g., streaming video, web surfing, etc.). Therefore, communication service providers require an infrastructure that can support high data rates, particularly in bandwidth-constrained systems. Higher-order modulation techniques that carry more than two bits per symbol, such as 8-PSK (Phase Shift Keying) and 16-QAM (Quadrature Amplitude Modulation), can provide more efficient bandwidth utilization. Unfortunately, conventional LDPC communication systems utilize a modulation scheme that carries binary or quaternary modulation whose signal waveforms representing the information are either binary anti-podal, or orthogonal to each other.

Therefore, there is a need for a satellite communication system that employs simple encoding and decoding processes, while minimizing cost. There is also a need for using LDPC codes efficiently to support high data rates, without introducing greater complexity. There is also a need to improve power and bandwidth efficiencies in a bandwidth constrained system, such as a satellite communication system.

SUMMARY OF THE INVENTION

These and other needs are addressed by the present invention, wherein an approach is provided for communicating over a satellite communication system utilizing structured Low Density Parity Check (LDPC) codes in conjunction with high order modulation schemes having signal constellations with two or more symbols represented by a signaling point. Structure of the LDPC codes is provided by restricting the parity check matrix to be lower triangular. The approach can advantageously exploit the unequal error protecting capability of LDPC codes on transmitted bits to provide extra error protection to more vulnerable bits of the high order modulation schemes (such as 8-PSK (Phase Shift Keying) and 16-QAM (Quadrature Amplitude Modulation). The above approach provides a bandwidth and power-efficient modulation techniques that are well suited for direct broadcast satellite or broadband satellite communications. Depending on the overall system link parameters, the approach can achieve high power efficiency and/or bandwidth efficiency, with simple decoding hardware, which is capable of high-speed operation.

According to one aspect of an embodiment of the present invention, a method for reliably communicating over a satellite in support of a communication service is disclosed. The method includes encoding an input message to output a structured Low Density Parity Check (LDPC) coded message. The method also includes modulating the coded message according to a high order modulation scheme, and transmitting the modulated signal over the satellite.

According to another aspect of an embodiment of the present invention, a satellite terminal for reliably communicating over a satellite in support of a communication service is disclosed. The terminal includes an encoder configured to output a structured Low Density Parity Check (LDPC) coded message in response to an input message. The terminal also includes a modulator configured to modulate the coded message according to a high order modulation scheme, wherein the modulated signal is transmitted over the satellite.

According to another aspect of an embodiment of the present invention, a satellite communication system supporting a communication service is disclosed. The system includes a first terminal configured to encode an input message to output a structured Low Density Parity Check (LDPC) coded message, and to modulate the coded message according to a high order modulation scheme, wherein the modulated signal is transmitted over a satellite. Also, the system includes a second terminal configured to receive the transmitted signal via the satellite.

According to another aspect of an embodiment of the present invention, a system for reliably communicating over a satellite in support of a communication service is disclosed. The system includes means for encoding an input message to output a structured Low Density Parity Check (LDPC) coded message, and modulating the coded message according to a high order modulation scheme that has a signal constellation representing more than two symbols per signaling point. The system also includes a transmitter configured to propagate the modulated signal over the satellite.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 8A and 8B are, respectively, a diagram of a non-Gray 8-PSK modulation scheme, and a Gray 8-PSK modulation, each of which can be used in the system of FIG. 1A;

DESCRIPTION OF THE PREFERRED EMBODIMENT

A system, method, and software for efficiently generating structured Low Density Parity Check (LDPC) codes are described. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

Figure 1A:
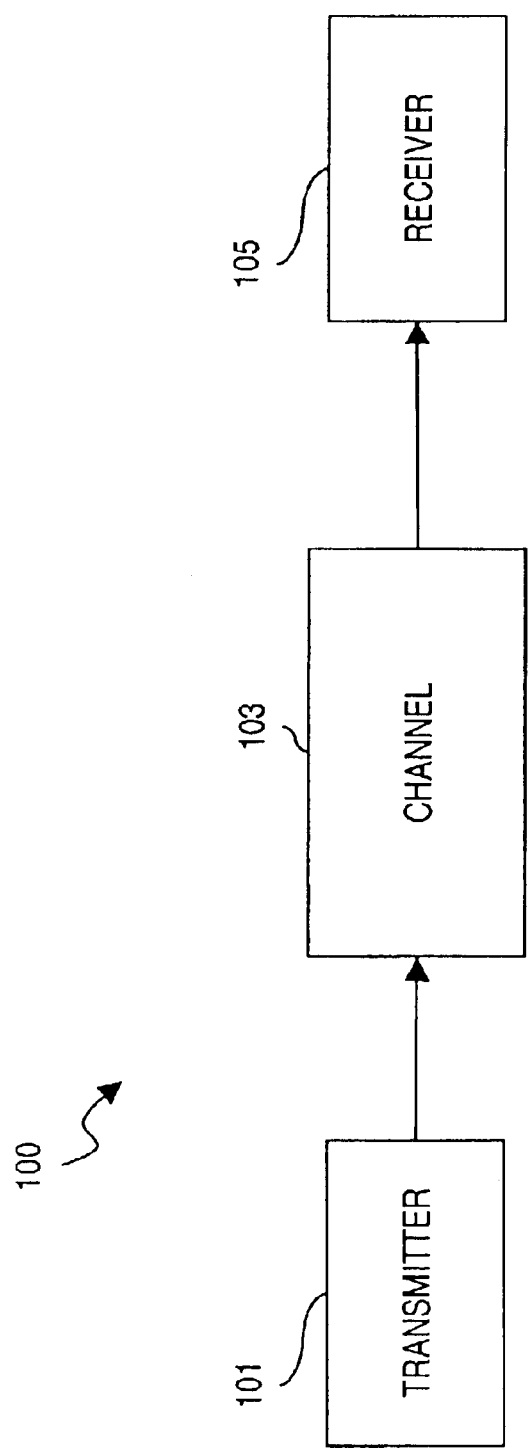
FIGS. 1A and 1B are, respectively, a diagram of a communication system configured to utilize Low Density Parity Check (LDPC) codes, and a diagram of a satellite communication system capable of providing high data rates using LDPC coding, according to an embodiment of the present invention.

FIG. 1A is a diagram of a communications system configured to utilize Low Density Parity Check (LDPC) codes, according to an embodiment of the present invention. A digital communications system 100 includes a transmitter 101 that generates signal waveforms across a communication channel 103 to a receiver 105. In this discrete communications system 100, the transmitter 101 has a message source that produces a discrete set of possible messages; each of the possible messages has a corresponding signal waveform. These signal waveforms are attenuated, or otherwise altered, by communications channel 103. To combat the noise channel 103, LDPC codes are utilized.

The LDPC codes that are generated by the transmitter 101 enable high speed implementation without incurring any performance loss. These structured LDPC codes output from the transmitter 101 avoid assignment of a small number of check nodes to the bit nodes already vulnerable to channel errors by virtue of the modulation scheme (e.g., 8-PSK).

Such LDPC codes have a parallelizable decoding algorithm (unlike turbo codes), which advantageously involves simple operations such as addition, comparison and table look-up. Moreover, carefully designed LDPC codes do not exhibit any sign of error floor.

According to one embodiment of the present invention, the transmitter 101 generates, using a relatively simple encoding technique, LDPC codes based on parity check matrices (which facilitate efficient memory access during decoding) to communicate with the receiver 105. The transmitter 101 employs LDPC codes that can outperform concatenated turbo+RS (Reed-Solomon) codes, provided the block length is sufficiently large.

Figure 1B:
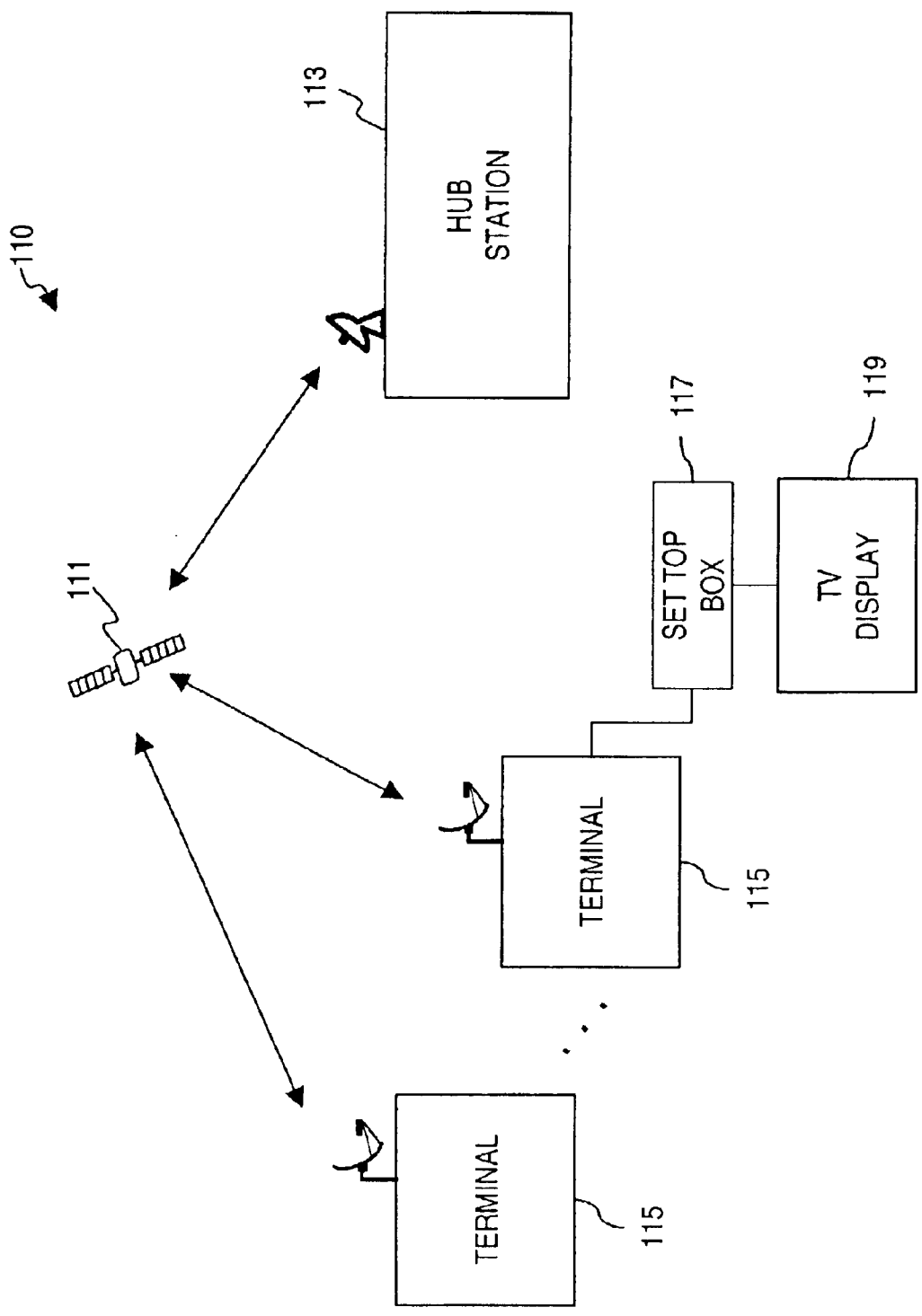

FIG. 1B shows a diagram of a satellite communication system capable of providing high data rates using LDPC coding, according to an embodiment of the present invention. The satellite system 110 utilizes LDPC codes to support, for example, data and telephony services via a satellite 111. The satellite 111 has a payload (not shown) that includes a demodulator that demodulates received signals from satellite terminals (STs) 115, a switch (not shown) that forwards the demodulated signal to an appropriate transponder (not shown), and a modulator (not shown) that modulates the signal from switch for transmission over the transponder (not shown). Also, the ST 113 can serve as a hub station (or Network Operation Center) that manages, with respect to access, security, and accounting, the communication with the STs 115.

The modulator and demodulator employ Low Density Parity Check (LDPC) codes to support high data rates by utilizing a structured LDPC scheme in conjunction with a high order modulation scheme—according to one embodiment of the present invention, the modulation scheme can 8-PSK (Phase Shift Keying) or 16-QAM (Quadrature Amplitude Modulation).

The satellite system 110 can be deployed to support a number of applications and configurations: direct video broadcast; Very Small Aperture Satellite (VSAT) type system; and on-board processing satellite. Under the direct video broadcast and VSAT configurations, the satellite 111 behaves as a repeater system, while the on-board processing satellite arrangement utilizes a switch in the payload to process traffic.

For example, in support of a direct broadcast satellite (DBS) provider, the system 110 can broadcast television programming from the hub station 113, which acts as a head-end, to the satellite terminals 115, which can include a set-top box 117 for interfacing with a television display 119. For direct broadcast satellite or broadband satellite applications, power and bandwidth efficiency are essential. Conventionally, a number of approaches have been developed to support the above satellite applications, using trellis coding or turbo trellis coding, to attempt to achieve power and bandwidth efficiencies. These coding approaches entail greater complexity. By contrast, LDPC coding can attain high power and bandwidth efficiency without the complexity, thereby reducing cost. For very high-speed links, such as those for broadband satellite applications, the LDPC scheme lends itself for parallel implementation that would otherwise be extremely difficult with the trellis coding or turbo trellis coding techniques.

In the on-board processing configuration, the switch residing in the satellite 111 is a fast packet switch; e.g., an ATM (Asynchronous Transfer Mode) switch, a Gigabit Ethernet switch, frame relay switch, etc. Included in the payload is a processor that performs such functions as capacity management functions and security functions.

According to an embodiment of the present invention, the satellite communication system 110 applies power efficient LDPC codes in conjunction with high order modulation schemes for broadband satellite applications. High order modulation schemes support a signal constellation that utilizes signaling points that represent more than two symbols per signaling point, such as 8-PSK, or 16-QAM. LDPC codes can deliver performance better than turbo trellis codes without noticeable error floor at higher signal-to-noise ratio (SNR). According to one embodiment of the present invention, the LDPC codes are concatenated with an outer Reed-Solomon (RS) outer code for even greater throughput. However, the LPDC does not need to be concatenated, for example, with the RS outer code, which is generally necessary for turbo codes to meet the requirements for digital video broadcast. That is, the outer RS code can be replaced with a relatively simple code, or eliminated completely. Thus, either fewer parity symbols are needed, or they can be eliminated from transmission. The data throughput can typically be increased by about 5–7% as a result of this particular feature.

Further, the LDPC decoder is considerably simpler to implement than a turbo decoder at higher code rates. LDPC decoder also has a highly parallizable architecture, which lends itself for high-speed operation.

The encoding process is first described below with respect to FIG. 2, and the LDPC decoder is explained in FIG. 3.

Figure 2:
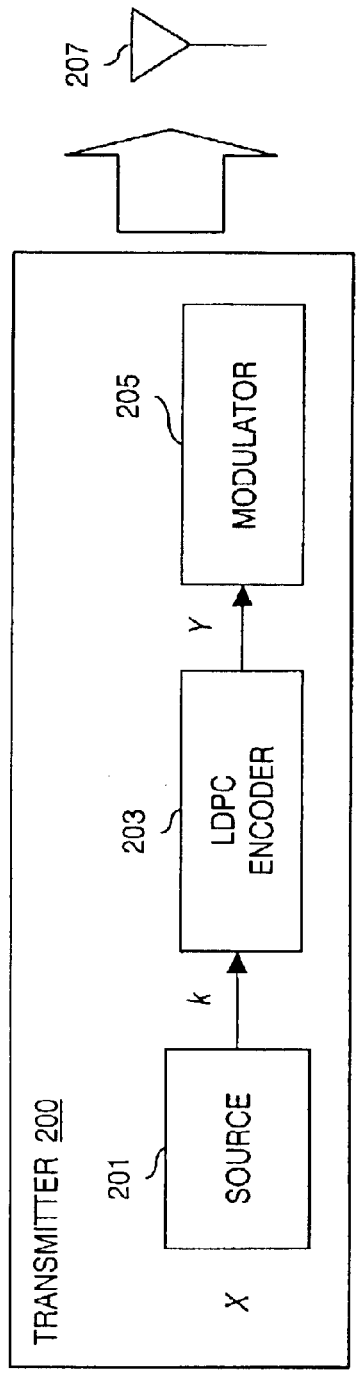
FIG. 2 is a diagram of an exemplary transmitter in the system of FIG. 1A.

FIG. 2 is a diagram of an exemplary transmitter in the system of FIG. 1A. A transmitter 200 is equipped with an LDPC encoder 203 that accepts input from an information source 201 and outputs coded stream of higher redundancy suitable for error correction processing at the receiver 105. The information source 201 generates k signals from a discrete alphabet, X. LDPC codes are specified with parity check matrices. On the other hand, encoding LDPC codes require, in general, specifying the generator matrices. Even though it is possible to obtain generator matrices from parity check matrices using Gaussian elimination, the resulting matrix is no longer sparse and storing a large generator matrix can be complex.

Encoder 203 generates signals from alphabet Y to a modulator 205 using a simple encoding technique that makes use of only the parity check matrix by imposing structure onto the parity check matrix. Specifically, a restriction is placed on the parity check matrix by constraining certain portion of the matrix to be triangular. The construction of such a parity check matrix is described, more fully below in FIG. 6. Such a restriction results in negligible performance loss, and therefore, constitutes an attractive trade-off.

Modulator 205 maps the encoded messages from encoder 203 to signal waveforms that are transmitted to a transmit antenna 207, which emits these waveforms over the communication channel 103. Accordingly, the encoded messages are modulated and distributed to a transmit antenna 207. The transmissions from the transmit antenna 207 propagate to a receiver, as discussed below.

Figure 3:
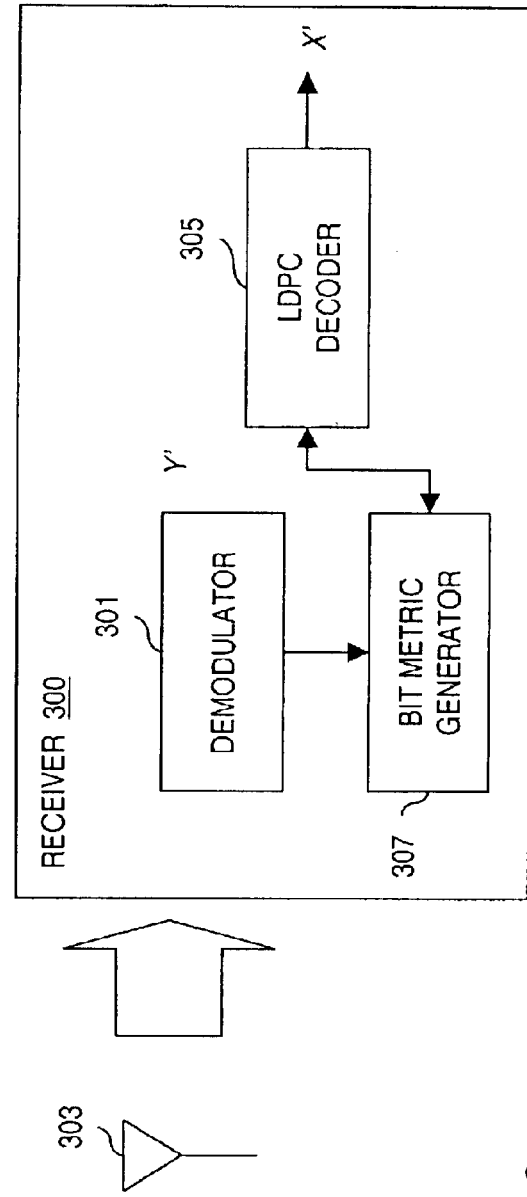
FIG. 3 is a diagram of an exemplary receiver in the system of FIG. 1A.

FIG. 3 is a diagram of an exemplary receiver in the system of FIG. 1A. At the receiving side, a receiver 300 includes a demodulator 301 that performs demodulation of received signals from transmitter 200. These signals are received at a receive antenna 303 for demodulation. After demodulation, the received signals are forwarded to a decoder 305, which attempts to reconstruct the original source messages by generating messages, X', in conjunction with a bit metric generator 307. With non-Gray mapping, the bit metric generator 307 exchanges probability information with the decoder 305 back and forth (iteratively) during the decoding process, which is detailed in FIG. 10. Alternatively, if Gray mapping is used (according to one embodiment of the present invention), one pass of the bit metric generator is sufficient, in which further attempts of bit metric generation after each LDPC decoder iteration are likely to yield limited performance improvement; this approach is more fully described with respect to FIG. 11. To appreciate the advantages offered by the present invention, it is instructive to examine how LDPC codes are generated, as discussed in FIG. 4.

Figures 4, 5, 6:
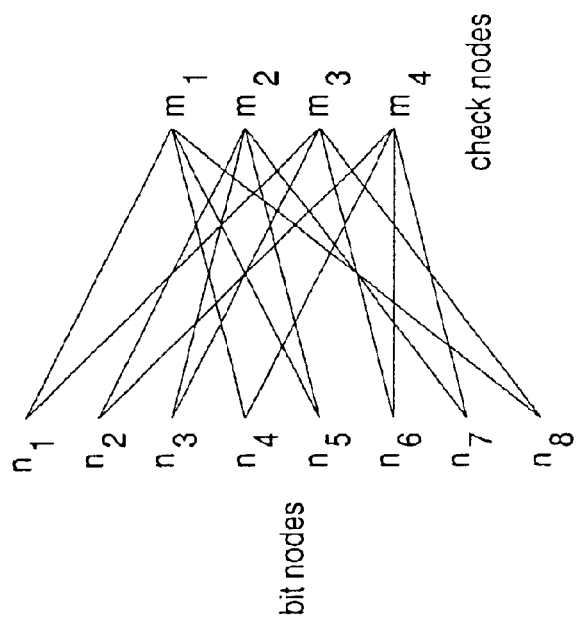
FIG. 4 is a diagram of a sparse parity check matrix, in accordance with an embodiment of the present invention.
FIG. 5 is a diagram of a bipartite graph of an LDPC code of the matrix of FIG. 4.
FIG. 6 is a diagram of a sub-matrix of a sparse parity check matrix, wherein the sub-matrix contains parity check values restricted to the lower triangular region, according to an embodiment of the present invention.

FIG. 4 is a diagram of a sparse parity check matrix, in accordance with an embodiment of the present invention. LDPC codes are long, linear block codes with sparse parity check matrix $H_{(n-k) \times n}$. Typically the block length, n, ranges from thousands to tens of thousands of bits. For example, a parity check matrix for an LDPC code of length n=8 and rate ½ is shown in FIG. 4. The same code can be equivalently represented by the bipartite graph, per FIG. 5.

FIG. 5 is a diagram of a bipartite graph of an LDPC code of the matrix of FIG. 4. Parity check equations imply that for each check node, the sum (over GF (Galois Field)(2)) of all adjacent bit nodes is equal to zero. As seen in the figure, bit nodes occupy the left side of the graph and are associated with one or more check nodes, according to a predetermined relationship. For example, corresponding to check node $m_1$, the following expression exists $n_1+n_4+n_5+n_8=0$ with respect to the bit nodes.

Returning the receiver 303, the LDPC decoder 305 is considered a message passing decoder, whereby the decoder 305 aims to find the values of bit nodes. To accomplish this task, bit nodes and check nodes iteratively communicate with each other. The nature of this communication is described below.

From check nodes to bit nodes, each check node provides to an adjacent bit node an estimate ("opinion") regarding the value of that bit node based on the information coming from other adjacent bit nodes. For instance, in the above example if the sum of $n_4$, $n_5$ and $n_8$ "looks like" 0 to $m_1$, then $m_1$ would indicate to $n_1$ that the value of $n_1$ is believed to be 0 (since $n_1+n_4+n_5+n_8=0$); otherwise $m_1$ indicate to $n_1$ that the value of $n_1$ is believed to be 1. Additionally, for soft decision decoding, a reliability measure is added.

From bit nodes to check nodes, each bit node relays to an adjacent check node an estimate about its own value based on the feedback coming from its other adjacent check nodes. In the above example $n_1$ has only two adjacent check nodes $m_1$ and $m_3$. If the feedback coming from $m_3$ to $n_1$ indicates that the value of $n_1$ is probably 0, then $n_1$ would notify $m_1$ that an estimate of $n_1$'s own value is 0. For the case in which the bit node has more than two adjacent check nodes, the bit node performs a majority vote (soft decision) on the feedback coming from its other adjacent check nodes before reporting that decision to the check node it communicates. The above process is repeated until all bit nodes are considered to be correct (i.e., all parity check equations are satisfied) or until a predetermined maximum number of iterations is reached, whereby a decoding failure is declared.

FIG. 6 is a diagram of a sub-matrix of a sparse parity check matrix, wherein the sub-matrix contains parity check values restricted to the lower triangular region, according to an embodiment of the present invention. As described previously, the encoder 203 (of FIG. 2) can employ a simple encoding technique by restricting the values of the lower triangular area of the parity check matrix. According to an embodiment of the present invention, the restriction imposed on the parity check matrix is of the form:

$$H_{(n-k)\times n}=[A_{(n-k)\times k}B_{(n-k)\times (n-k)}],$$

where B is lower triangular.

Any information block $i=(i_0, i_1, \ldots, i_{k-1})$ is encoded to a codeword $c=(i_0, i_1, \ldots, i_{k-1}, p_0, p_1, \ldots, p_{n-k-1})$ using $Hc^T=0$, and recursively solving for parity bits; for example, $$a_{00}i_0+a_{01}i_1'\ldots +a_{0,k-1}i_{k-1}+p_0=0 \rightarrow \text{Solve } p_0,$$

$$a_{10}i_0+a_{11}i_1+\ldots +a_{1,k-1}i_{k-1}+b_{10}p_0+p_1=0 \rightarrow \text{Solve } p_1$$

and similarly for $p_2, p_3, \ldots, p_{n-k-1}$.

Figure 7:
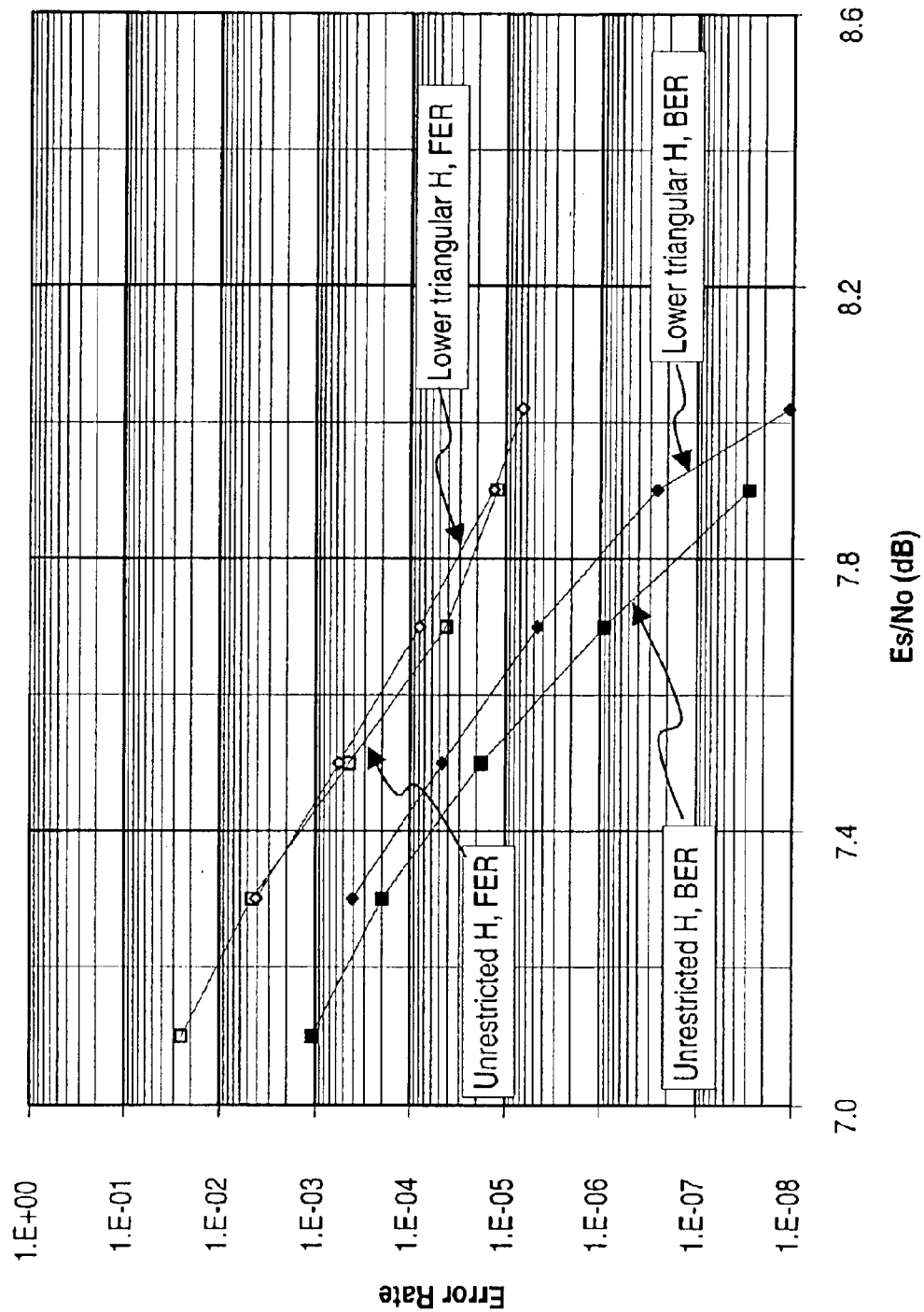
FIG. 7 is a graph showing performance between codes utilizing unrestricted parity check matrix (H matrix) versus restricted H matrix having a sub-matrix as in FIG. 6.

FIG. 7 is a graph showing performance between codes utilizing unrestricted parity check matrix (H matrix) versus restricted H matrix of FIG. 6. The graph shows the performance comparison between two LDPC codes: one with a general parity check matrix and the other with a parity check matrix restricted to be lower triangular to simplify encoding. The modulation scheme, for this simulation, is 8-PSK. The performance loss is within 0.1 dB. Therefore, the performance loss is negligible based on the restriction of the lower triangular H matrices, while the gain in simplicity of the encoding technique is significant. Accordingly, any parity check matrix that is equivalent to a lower triangular or upper triangular under row and/or column permutation can be utilized for the same purpose.

Figures 8A, 8B:
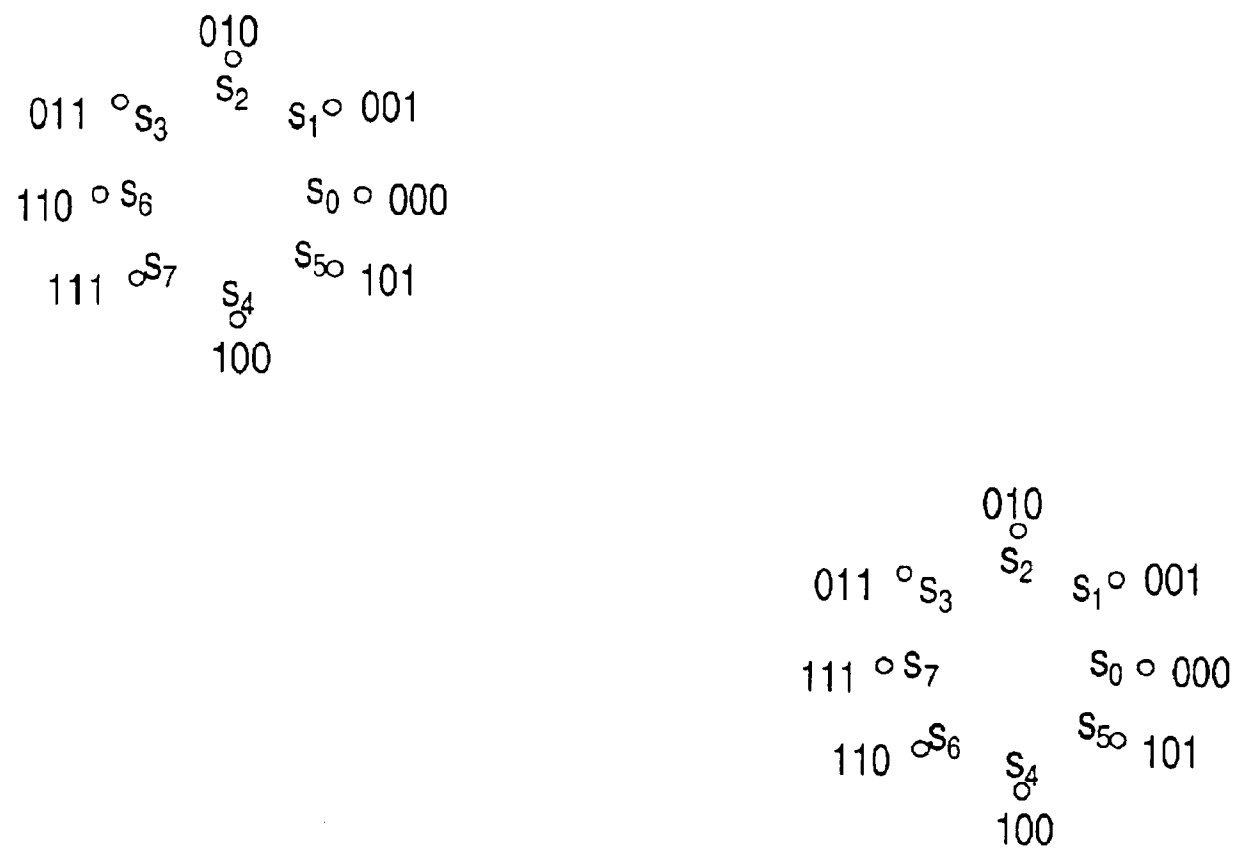

FIGS. 8A and 8B are, respectively, a diagram of a non-Gray 8-PSK modulation scheme, and a Gray 8-PSK modulation, each of which can be used in the system of FIG. 1A. The non-Gray 8-PSK scheme of FIG. 8A can be utilized in the receiver of FIG. 3 to provide a system that requires very low Frame Erasure Rate (FER). This requirement can also be satisfied by using a Gray 8-PSK scheme, as shown in FIG. 8B, in conjunction with an outer code, such as Bose, Chaudhuri, and Hocquenghem (BCH), Hamming, or Reed-Solomon (RS) code.

FIG. 7 is a graph showing performance between codes utilizing unrestricted parity check matrix (H matrix) versus restricted H matrix of FIG. 6. The graph shows the performance comparison between two LDPC codes: one with a general parity check matrix and the other with a parity check matrix restricted to be lower triangular (i.e., restricted H matrix) to simplify encoding. The modulation scheme, for this simulation, is 8-PSK. The performance loss is within 0.1 dB. Therefore, the performance loss is negligible based on the restriction of the lower triangular H matrices, where the gain in simplicity of the encoding technique is significant. Accordingly, any parity check matrix that is equivalent to a lower triangular or upper triangular under row and/or column permutation can be utilized for the same purpose.

Figure 9:
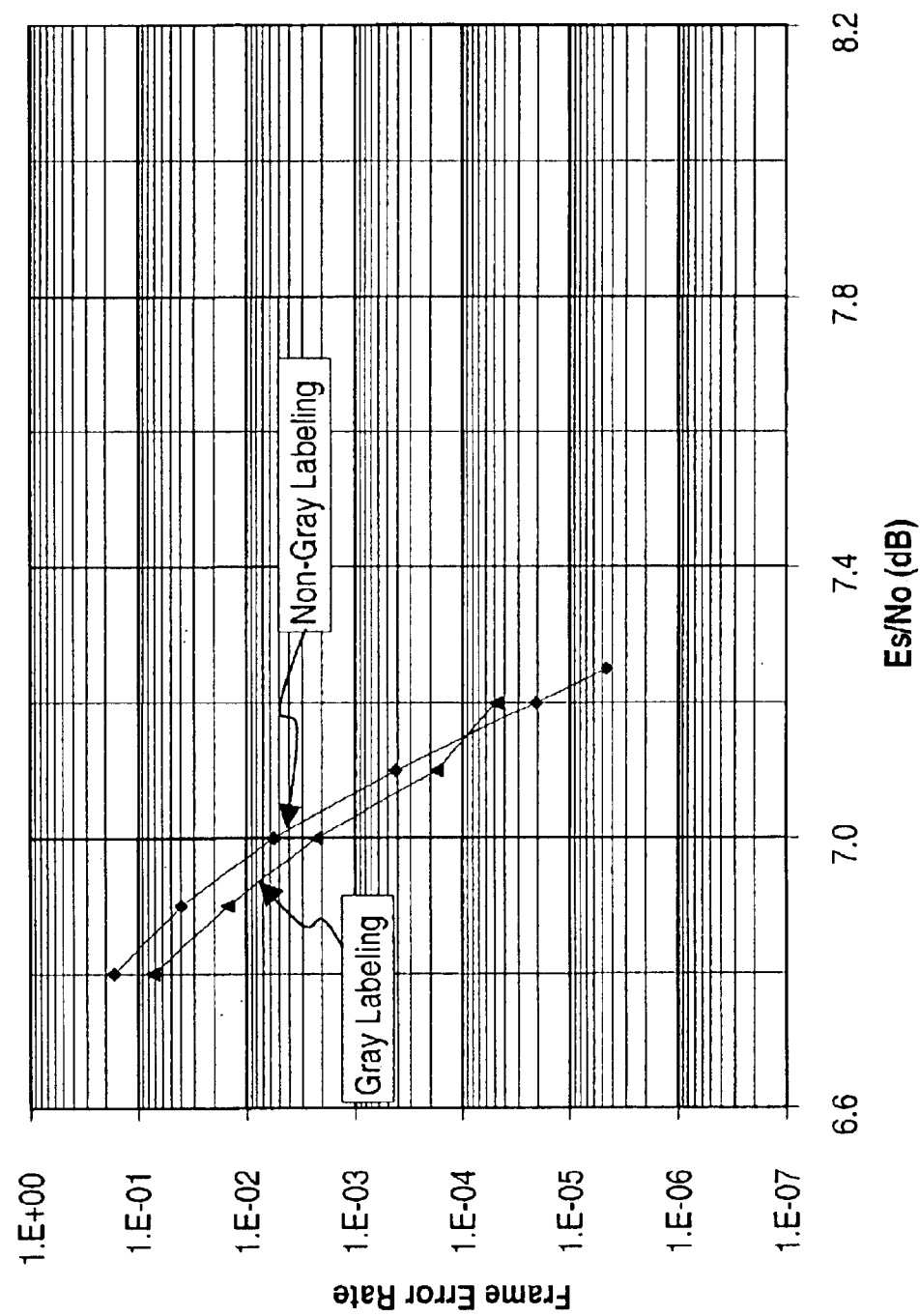
FIG. 9 is a graph showing performance between codes utilizing Gray labeling versus non-Gray labeling.

FIG. 9 is a graph showing performance between codes utilizing Gray labeling versus non-Gray labeling of FIGS. 8A and 8B. The error floor stems from the fact that assuming correct feedback from LDPC decoder 305, regeneration of 8-PSK bit metrics is more accurate with non-Gray labeling since the two 8-PSK symbols with known two bits are further apart with non-Gray labeling. This can be equivalently seen as operating at higher Signal-to-Noise Ratio (SNR). Therefore, even though error asymptotes of the same LDPC code using Gray or non-Gray labeling have the same slope (i.e., parallel to each other), the one with non-Gray labeling passes through lower FER at any SNR.

On the other hand, for systems that do not require very low FER, Gray labeling without any iteration between LDPC decoder 305 and 8-PSK bit metric generator 307 may be more suitable because re-generating 8-PSK bit metrics before every LDPC decoder iteration causes additional complexity. Moreover, when Gray labeling is used, re-generating 8-PSK bit metrics before every LDPC decoder iteration yields only very slight performance improvement. As mentioned previously, Gray labeling without iteration may be used for systems that require very low FER, provided an outer code is implemented.

The choice between Gray labeling and non-Gray labeling depends also on the characteristics of the LDPC code. Typically, the higher bit or check node degrees, the better it is for Gray labeling, because for higher node degrees, the initial feedback from LDPC decoder 305 to 8-PSK (or similar higher order modulation) bit metric generator 307 deteriorates more with non-Gray labeling.

When 8-PSK (or similar higher order) modulation is utilized with a binary decoder, it is recognized that the three (or more) bits of a symbol are not received "equally noisy". For example with Gray 8-PSK labeling, the third bit of a symbol is considered more noisy to the decoder than the other two bits. Therefore, the LDPC code design does not assign a small number of edges to those bit nodes represented by "more noisy" third bits of 8-PSK symbol so that those bits are not penalized twice.

Figure 10:
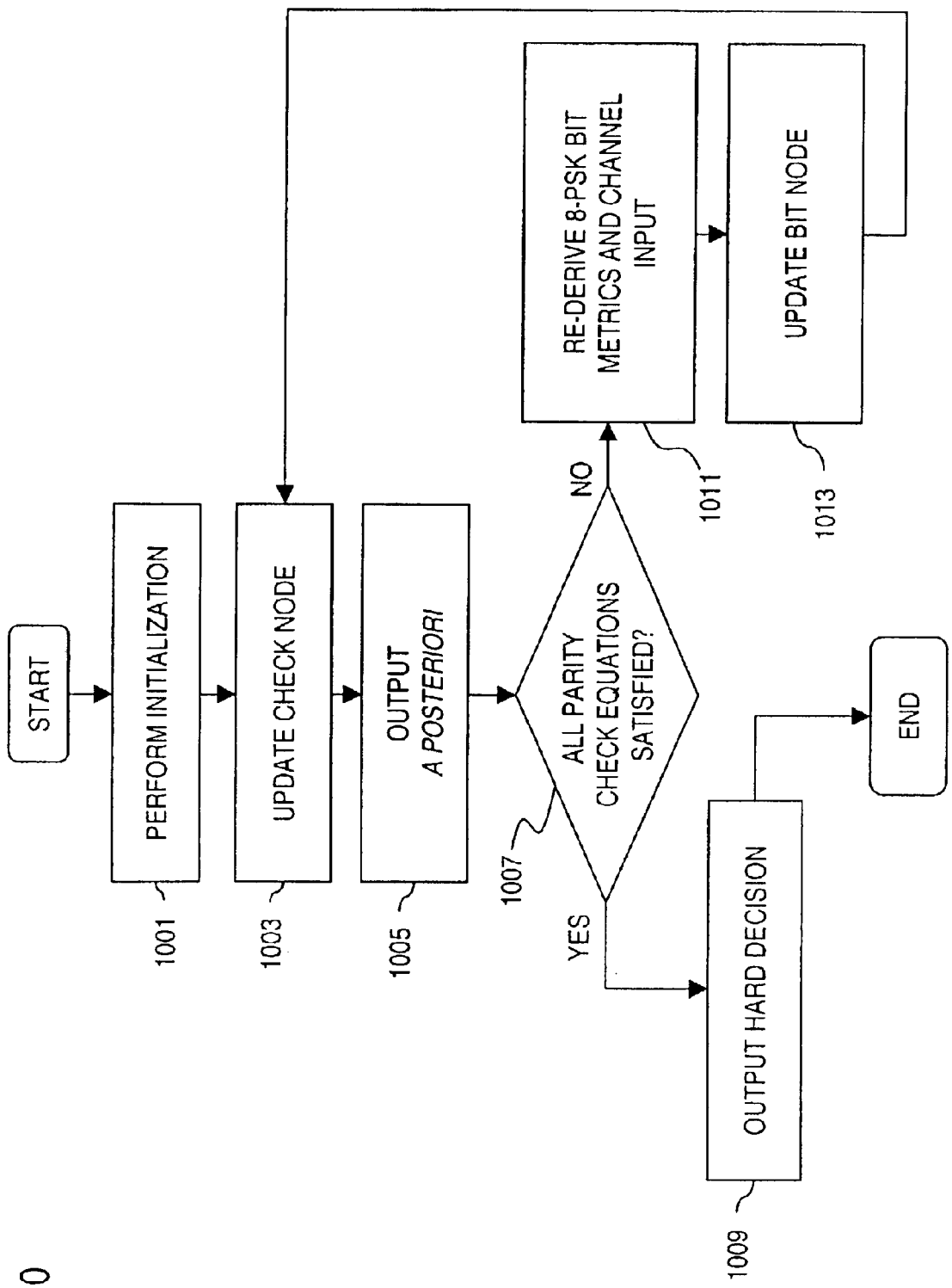
FIG. 10 is a flow chart of the operation of the LDPC decoder using non-Gray mapping, according to an embodiment of the present invention.

FIG. 10 is a flow chart of the operation of the LDPC decoder using non-Gray mapping, according to an embodiment of the present invention. Under this approach, the LDPC decoder and bit metric generator iterate one after the other. In this example, 8-PSK modulation is utilized; however, the same principles apply to other higher modulation schemes as well. Under this scenario, it is assumed that the demodulator 301 outputs a distance vector, d, denoting the distances between received noisy symbol points and 8-PSK symbol points to the bit metric generator 307, whereby the vector components are as follows:

$$d_i = -\frac{E_s}{N_0} \{(r_x - s_{i,x})^2 + (r_y - s_{i,y})^2\} \; i = 0, 1, \ldots 7.$$

The 8-PSK bit metric generator 307 communicates with the LDPC decoder 305 to exchange a priori probability information and a posteriori probability information, which respectively are represented as u, and a. That is, the vectors u and a respectively represent a priori and a posteriori probabilities of log likelihood ratios of coded bits.

The 8-PSK bit metric generator 307 generates the a priori likelihood ratios for each group of three bits as follows. First, extrinsic information on coded bits is obtained:

$$e_j = a_j - u_j \; j=0, 1, 2.$$

Next, 8-PSK symbol probabilities, $p_i$ i=0, 1, . . . , 7, are determined.

\*$y_j = -f(0, e_j)$ j=0, 1, 2 where $f(a,b)=\max(a,b)+LUT_f(a,b)$ with $LUT_f(a,b)=\ln(1+e^{-|a-b|})$ \*$x_j = y_j + e_j$ j=0, 1, 2

\*$p_0 = x_0 + x_1 + x_2$ $p_4 = y_0 + x_1 + x_2$ $p_1 = x_0 + x_1 + y_2$ $p_5 = y_0 + x_1 + y_2$ $p_2 = x_0 + y_1 + x_2$ $p_6 = y_0 + y_1 + x_2$ $p_3 = x_0 + y_1 + y_2$ $p_7 = y_0 + y_1 + y_2$

Next, the bit metric generator 307 determines a priori log likelihood ratios of the coded bits as input to LDPC decoder 305, as follows:

$u_0 = f(d_0 + p_0, d_1 + p_1, d_2 + p_2, d_3 + p_3) - f(d_4 + p_4, d_5 + p_5, d_6 + p_6, d_7 + p_7) - e_0$ $u_1 = f(d_0 + p_0, d_1 + p_1, d_4 + p_4, d_5 + p_5) - f(d_2 + p_2, d_3 + p_3, d_6 + p_6, d_7 + p_7) - e_1$ $u_2 = f(d_0 + p_0, d_2 + p_2, d_4 + p_4, d_6 + p_6) - f(d_1 + p_1, d_3 + p_3, d_5 + p_5, d_7 + p_7) - e_2$

It is noted that the function f(.) with more than two variables can be evaluated recursively; e.g. f(a,b,c)=f(f(a,b), c).

Figure 12C:
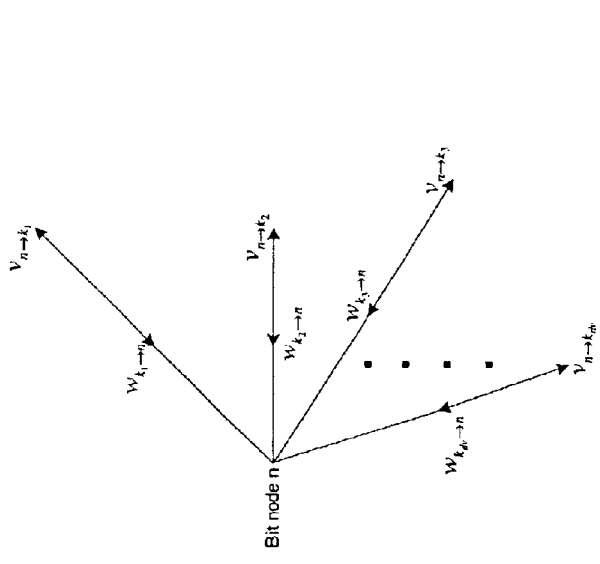
FIGS. 12A–12C are diagrams of the interactions between the check nodes and the bit nodes in a decoding process, according to an embodiment of the present invention.
Figure 12B:
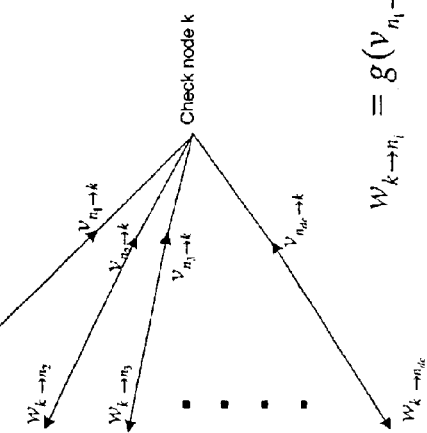
Figure 12A:
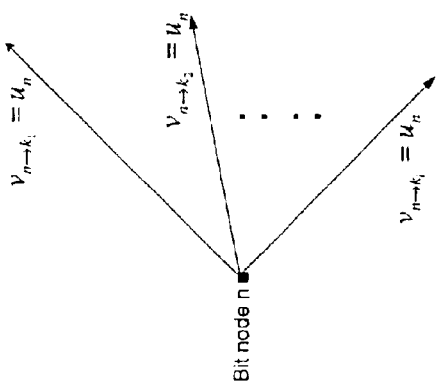

The operation of the LDPC decoder 305 utilizing non-Gray mapping is now described. In step 1001, the LDPC decoder 305 initializes log likelihood ratios of coded bits, v, before the first iteration according to the following (and as shown in FIG. 12A):

$$v_{n \to k_i} = u_n, \; n=0, 1, \ldots, N-1, i=1, 2, \ldots, \deg(\text{bit node } n)$$

Here, $v_{n \to k_i}$ denotes the message that goes from bit node n to its adjacent check node $k_i$, $u_n$ denotes the demodulator output for the bit n and N is the codeword size.

In step 1003, a check node, k, is updated, whereby the input v yields the output w. As seen in FIG. 12B, the incoming messages to the check node k from its $d_c$ adjacent bit nodes are denoted by $v_{n_1 \to k}, v_{n_2 \to k}, \ldots, v_{n_{dc} \to k}$. The goal is to compute the outgoing messages from the check node k back to $d_c$ adjacent bit nodes. These messages are denoted by $w_{k \to n_1}, w_{k \to n_2}, \ldots, w_{k \to n_{dc}}$, where $$w_{k \to n_i} = g(v_{n_1 \to k}, v_{n_2 \to k}, \ldots, v_{n_{i-1} \to k}, v_{n_{i+1} \to k}, \ldots, v_{n_{dc} \to k}).$$

The function g( ) is defined as follows:

$$g(a,b) = \text{sign}(a) \times \text{sign}(b) \times \{\min(|a|,|b|)\} + LUT_g(a,b),$$

where $LUT_g(a,b) = \ln(1+e^{-|a+b|}) - \ln(1+e^{-|a-b|})$. Similar to function f, function g with more than two variables can be evaluated recursively.

Next, the decoder 305, per step 1205, outputs a posteriori probability information (FIG. 12C), such that:

$$a_n = u_n + \sum_j w_{k_j \to n}$$

Per step 1007, it is determined whether all the parity check equations are satisfied. If these parity check equations are not satisfied, then the decoder 305, as in step 1009, re-derives 8-PSK bit metrics and channel input $u_n$. Next, the bit node is updated, as in step 1011. As shown in FIG. 13C, the incoming messages to the bit node n from its $d_v$ adjacent check nodes are denoted by $w_{k_1 \to n}, w_{k_2 \to n}, \ldots, w_{k_{dv} \to n}$. The outgoing messages from the bit node n are computed back to $d_v$ adjacent check nodes; such messages are denoted by $v_{n \to k_1}, v_{n \to k_2}, \ldots, v_{n \to k_{dv}}$, and computed as follows:

$$v_{n \to k_i} = u_n + \sum_{j \neq i} w_{k_j \to n}$$

In step 1013, the decoder 305 outputs the hard decision (in the case that all parity check equations are satisfied):

$$\hat{c}_n = \begin{cases} 0, & a_n \geq 0 \\ 1, & a_n < 0 \end{cases} \text{ Stop if } H\hat{c}^T = 0$$

The above approach is appropriate when non-Gray labeling is utilized. However, when Gray labeling is implemented, the process of FIG. 11 is executed.

Figure 11:
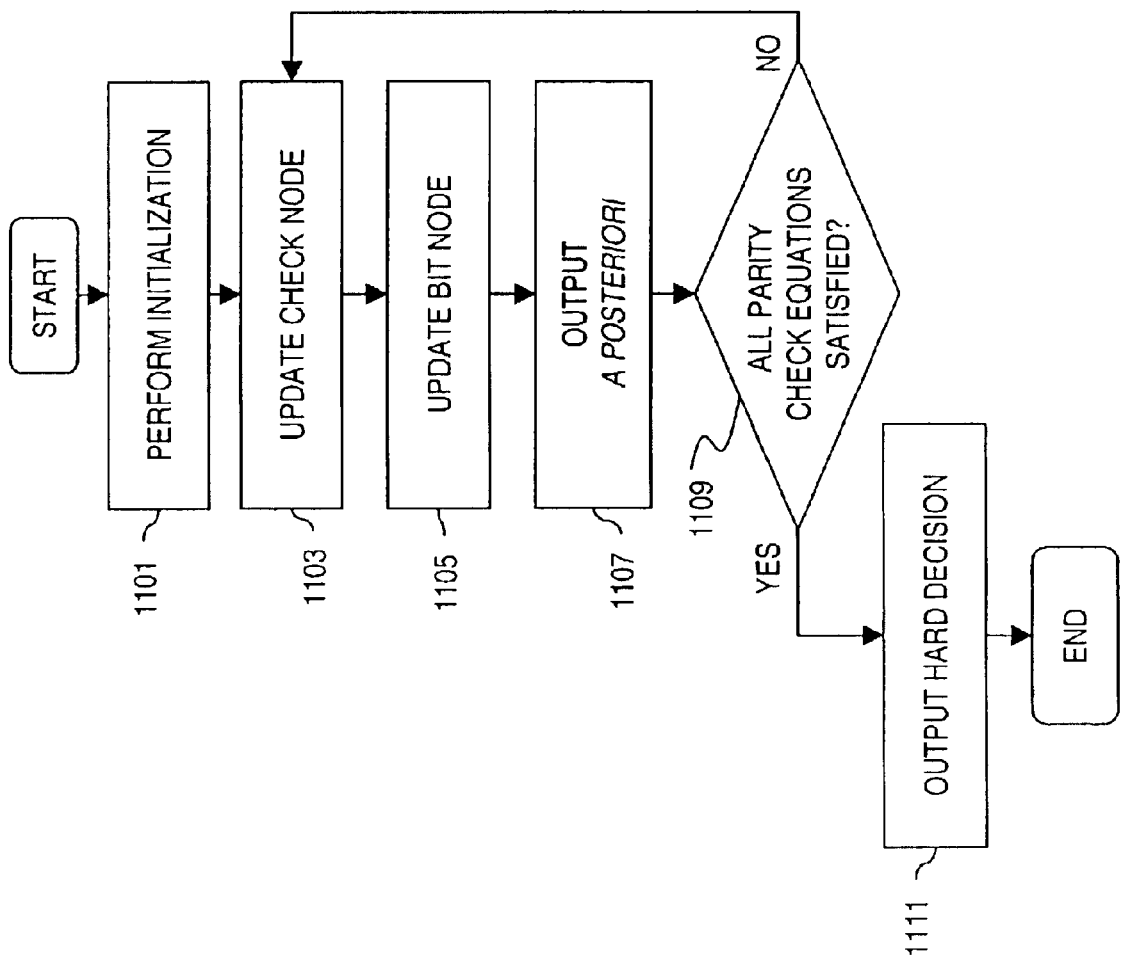
FIG. 11 is a flow chart of the operation of the LDPC decoder of FIG. 3 using Gray mapping, according to an embodiment of the present invention.

FIG. 11 is a flow chart of the operation of the LDPC decoder of FIG. 3 using Gray mapping, according to an embodiment of the present invention. When Gray labeling is used, bit metrics are advantageously generated only once before the LDPC decoder, as re-generating bit metrics after every LDPC decoder iteration may yield nominal performance improvement. As with steps 1001 and 1003 of FIG. 10, initialization of the log likelihood ratios of coded bits, v, are performed, and the check node is updated, per steps 1101 and 1103. Next, the bit node n is updated, as in step 1105. Thereafter, the decoder outputs the a posteriori probability information (step 1107). In step 1109, a determination is made whether all of the parity check equations are satisfied; if so, the decoder outputs the hard decision (step 1111). Otherwise, steps 1103–1107 are repeated.

Figure 13A:
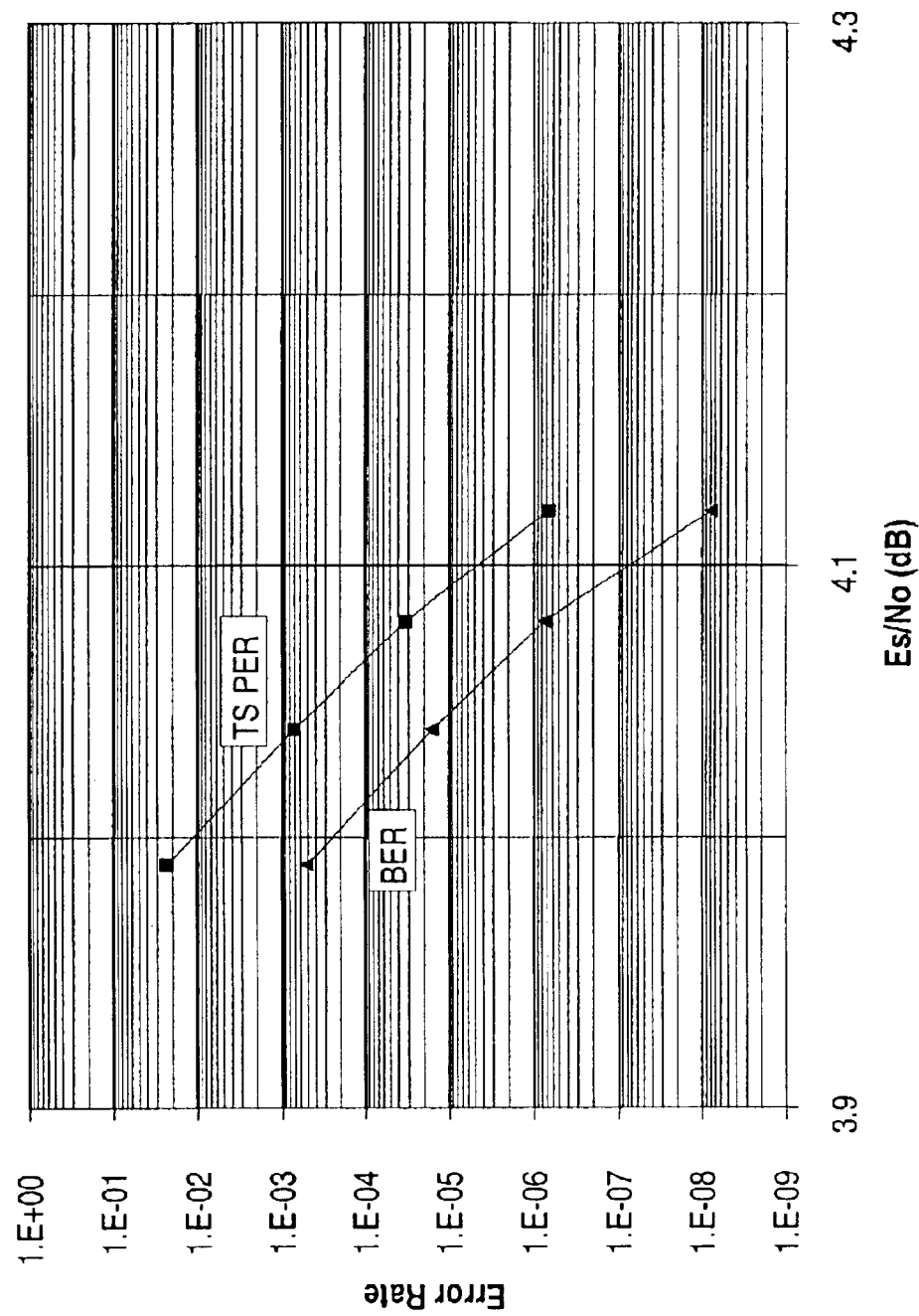
FIGS. 13A–13C are graphs showing simulation results of LDPC codes generated in accordance with various embodiments of the present invention.
Figure 13B:
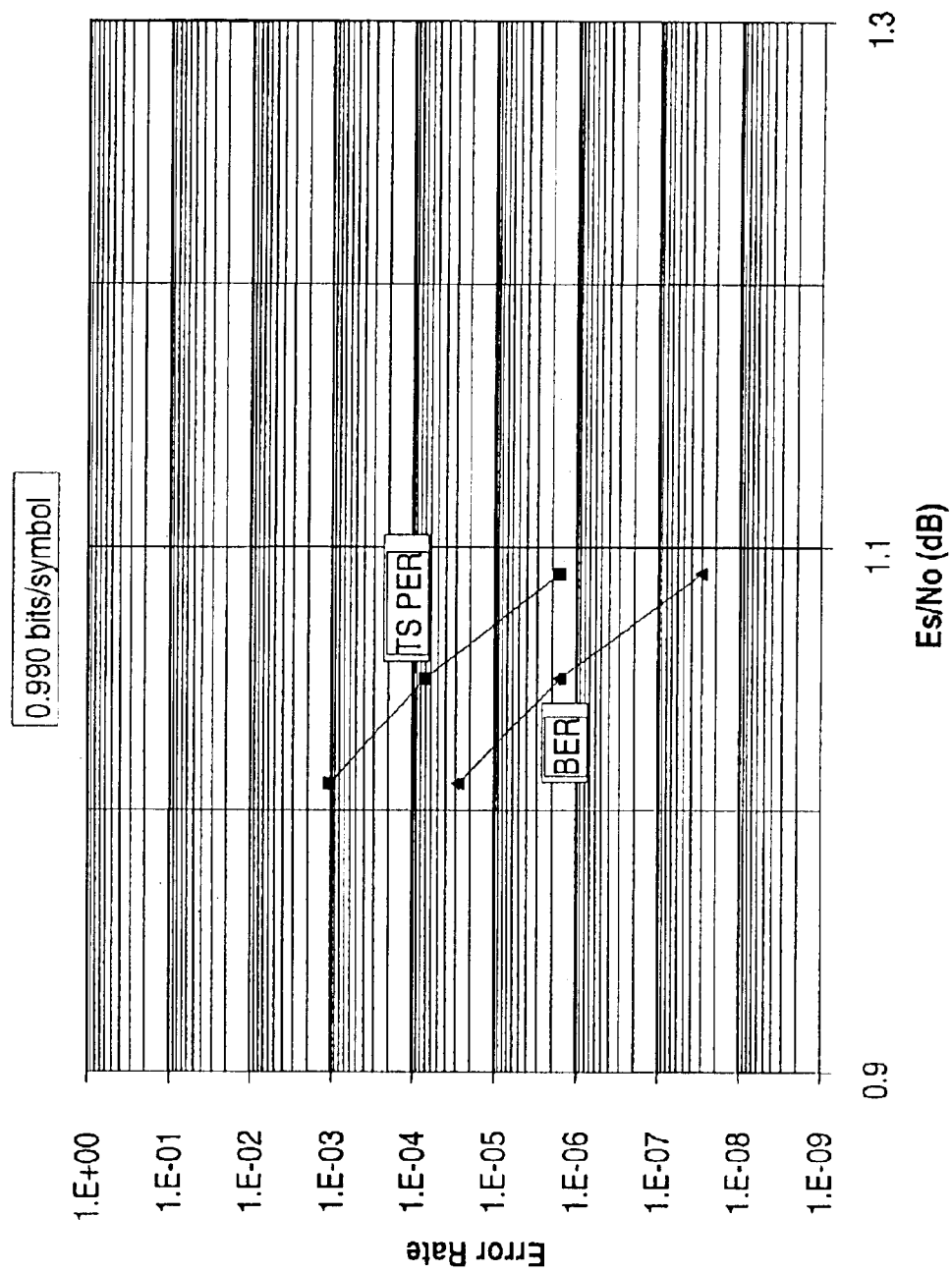
Figure 13C:
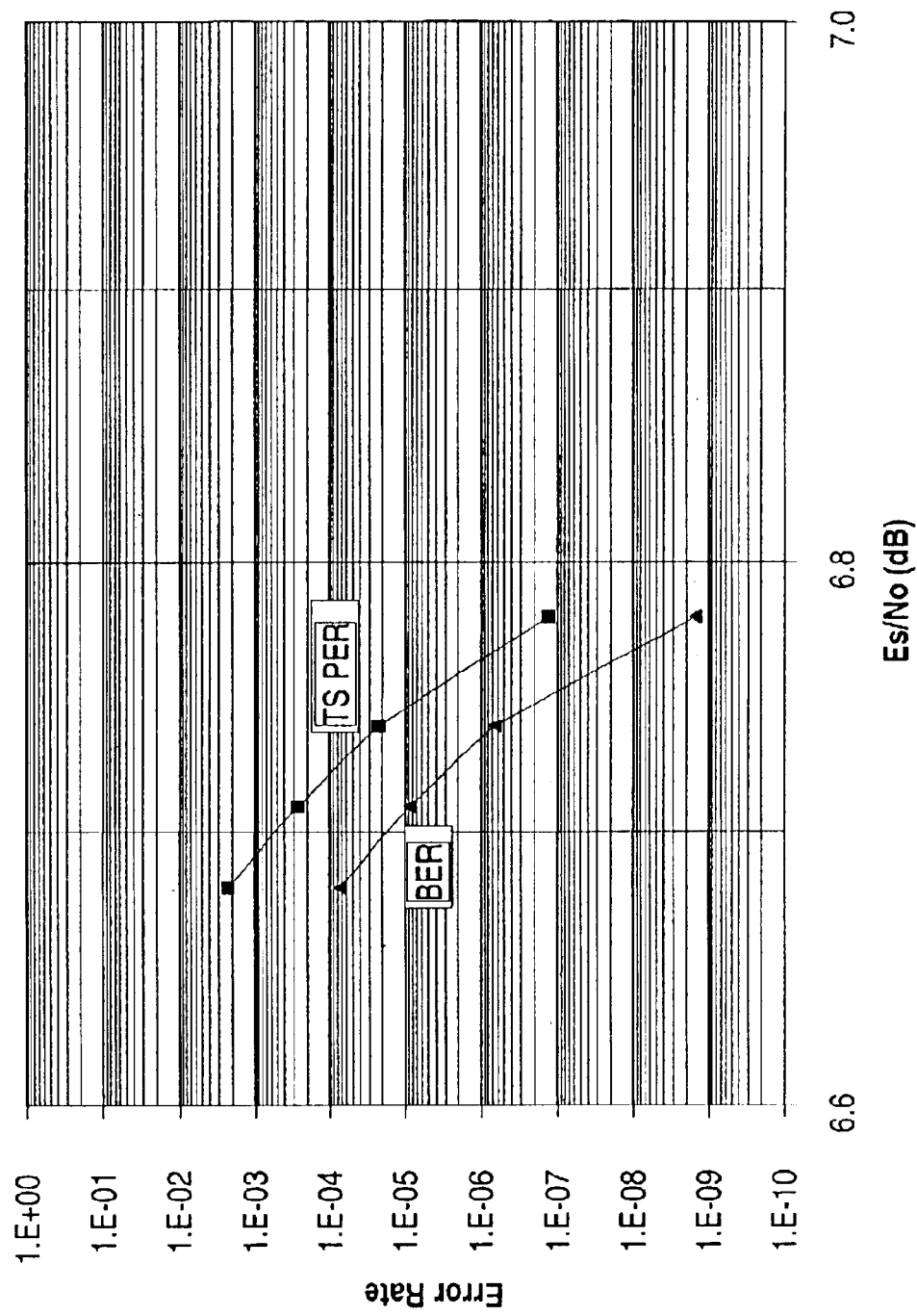

FIGS. 13A–13C are graphs showing simulation results of LDPC codes generated in accordance with various embodiments of the present invention. In particular, FIGS.

13A–13C show the performance of LDPC codes with higher order modulation and code rates of 3/4 (QPSK, 1.485 bits/symbol), 2/3 (8-PSK, 1.980 bits/symbol), and 5/6 (8-PSK, 2.474 bits/symbol).

Two general approaches exist to realize the interconnections between check nodes and bit nodes: (1) a fully parallel approach, and (2) a partially parallel approach. In fully parallel architecture, all of the nodes and their interconnections are physically implemented. The advantage of this architecture is speed.

Next, the decoder 305, per step 1005, outputs a posteriori probability information (FIG. 12C), such that:

$$a_n = u_n + \Sigma w_{k_j \to n}.$$

The second approach to implementing LDPC codes is to physically realize only a subset of the total number of the nodes and to use only this limited number of "physical" nodes to process all of the "functional" nodes of the code. Even though the LDPC decoder operations can be made extremely simple and can be performed in parallel, the further challenge in the design is how the communication is established between "randomly" distributed bit nodes and check nodes. The decoder 305, of FIG. 3, according to one embodiment of the present invention, addresses this problem by accessing memory in a structured way, as to realize a seemingly random code. This approach is explained with respect to FIGS. 14A and 14B.

Figure 14A:
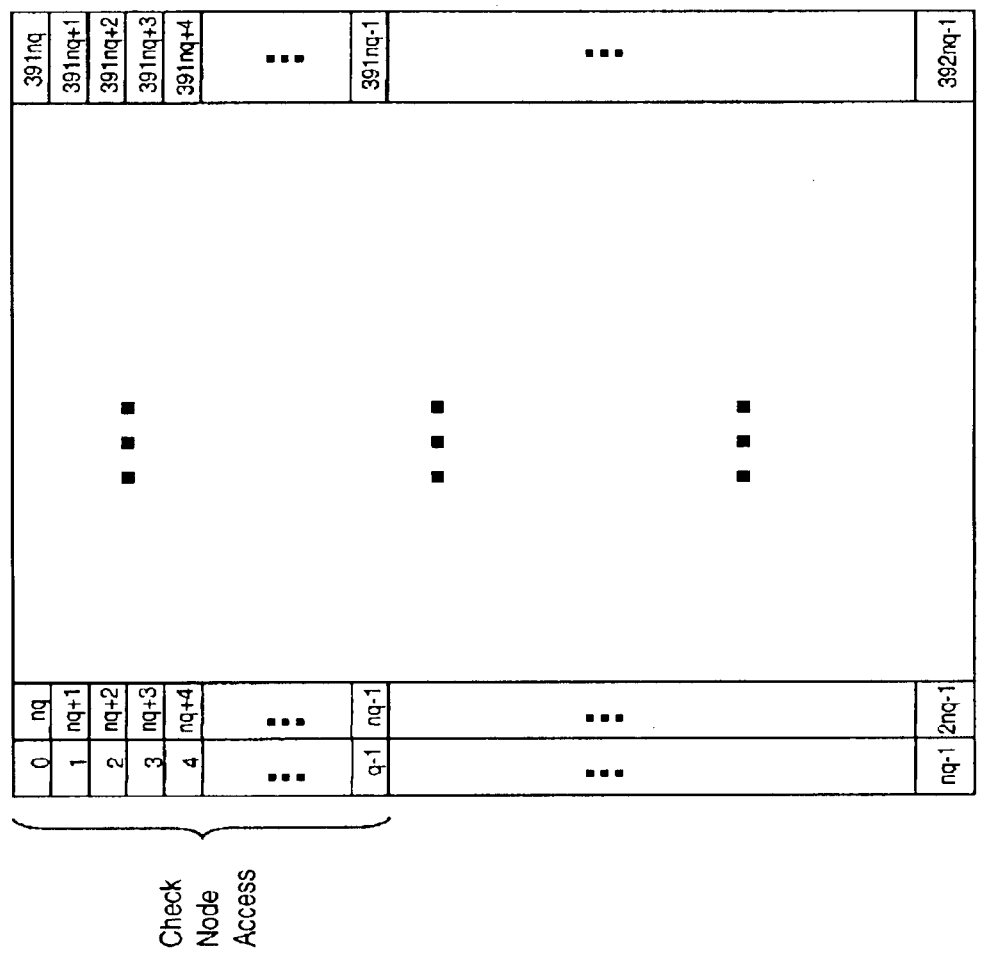
FIGS. 14A and 14B are diagrams of the top edge and bottom edge, respectively, of memory organized to support structured access as to realize randomness in LDPC coding, according to an embodiment of the present invention.
Figure 14B:
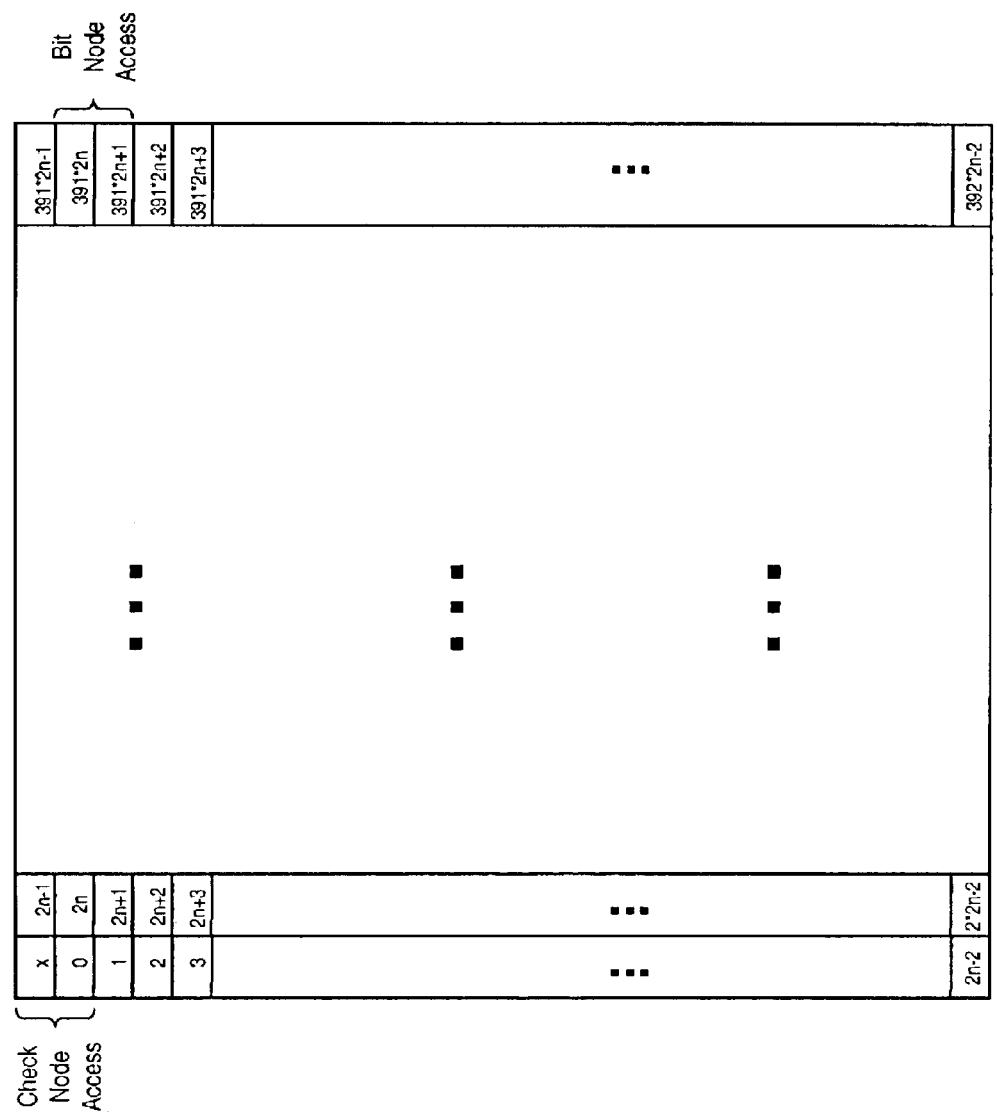

FIGS. 14A and 14B are diagrams of the top edge and bottom edge, respectively, of memory organized to support structured access as to realize randomness in LDPC coding, according to an embodiment of the present invention. Structured access can be achieved without compromising the performance of a truly random code by focusing on the generation of the parity check matrix. In general, a parity check matrix can be specified by the connections of the check nodes with the bit nodes. For example, the bit nodes are divided into groups of 392 (392 is provided for the purposes of illustration). Additionally, assuming the check nodes connected to the first bit node of degree 3, for instance, are numbered as a, b and c, then the check nodes connected to the second bit node are numbered as a+p, b+p and c+p, the check nodes connected to the third bit node are numbered as a+2p, b+2p and c+2p etc. For the next group of 392 bit nodes, the check nodes connected to the first bit node are different from a, b, c so that with a suitable choice of p, all the check nodes have the same degree. A random search is performed over the free constants such that the resulting LDPC code is cycle-4 and cycle-6 free.

The above arrangement facilitates memory access during check node and bit node processing. The values of the edges in the bipartite graph can be stored in a storage medium, such as random access memory (RAM). It is noted that for a truly random LDPC code during check node and bit node processing, the values of the edges would need to be accessed one by one in a random fashion. However, such an access scheme would be too slow for a high data rate application. The RAM of FIGS. 14A and 14B are organized in a manner, whereby a large group of relevant edges in one clock cycle; accordingly, these values are placed "together" in memory. It is observed that, in actuality, even with a truly random code, for a group of check nodes (and respectively bit nodes), the relevant edges can be placed next to one another in RAM, but then the relevant edges adjacent to a group of bit nodes (respectively check nodes) will be randomly scattered in RAM. Therefore, the "togetherness," under the present invention, stems from the design of the parity check matrices themselves. That is, the check matrix design ensures that the relevant edges for a group of bit nodes and check nodes are simultaneously placed together in RAM.

As seen in FIGS. 14A and 14B, each box contains the value of an edge, which is multiple bits (e.g., 6). Edge RAM, according to one embodiment of the present invention, is divided into two parts: top edge RAM (FIG. 14A) and bottom edge RAM (FIG. 14B). Bottom edge RAM contains the edges between bit nodes of degree 2, for example, and check nodes. Top edge RAM contains the edges between bit nodes of degree greater than 2 and check nodes. Therefore, for every check node, 2 adjacent edges are stored in the bottom RAM, and the rest of the edges are stored in the top edge RAM.

Continuing with the above example, a group of 392 bit nodes and 392 check nodes are selected for processing at a time. For 392 check node processing, q consecutive rows are accessed from the top edge RAM, and 2 consecutive rows from the bottom edge RAM. In this instance, q+2 is the degree of each check node. For bit node processing, if the group of 392 bit nodes has degree 2, their edges are located in 2 consecutive rows of the bottom edge RAM. If the bit nodes have degree d>2, their edges are located in some d rows of the top edge RAM. The address of these d rows can be stored in non-volatile memory, such as Read-Only Memory (ROM). The edges in one of the rows correspond to the first edges of 392 bit nodes, the edges in another row correspond to the second edges of 392 bit nodes, etc. Moreover for each row, the column index of the edge that belongs to the first bit node in the group of 392 can also be stored in ROM. The edges that correspond to the second, third, etc. bit nodes follow the starting column index in a "wrapped around" fashion. For example, if the $j^{th}$ edge in the row belongs to the first bit node, then the (j+1)st edge belongs to the second bit node, (j+2)nd edge belongs to the third bit node, . . . , and (j−1)st edge belongs to the $392^{th}$ bit node.

With the above organization (shown in FIGS. 14A and 14B), speed of memory access is greatly enhanced during LDPC coding. Further, the performance advantages of LDPC codes are more evident in the code design comparison chart of FIG. 15.

Figure 15:
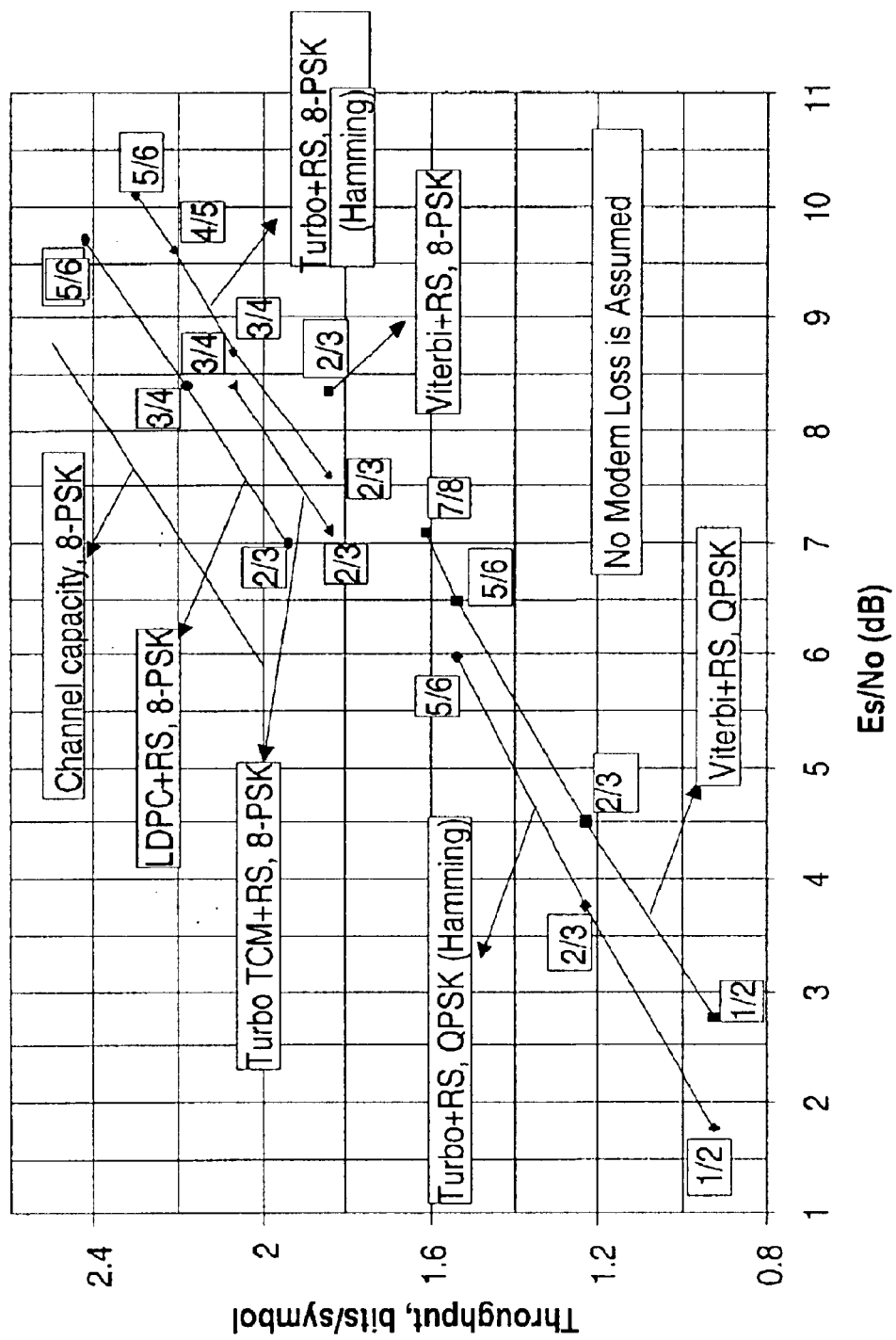
FIG. 15 is a graph of a performance comparison of LDPC coding with different coding schemes.

FIG. 15 is a graph of a performance comparison of LDPC coding with different coding schemes. Specifically, the graph shows a Bit Error Rate (BER) performance of two rate 5/6 LDPC codes and a rate 5/6 turbo trellis code concatenated with a Reed-Solomon outer code, all in conjunction with 8-PSK modulation. It can be seen that both LDPC codes outperform the turbo code concatenated with Reed-Solomon outer code. Not only can the LDPC code be operated at lower Es/No, but also provides, for example, more than 3 Mbps of additional throughput for a 27 MHz transponder.

As discussed previously, the decoding complexity of LDPC codes advantageously does not increase with the length of the code. This property allows the use of very long codes for better performance, until such return is diminished. From a practical standpoint, longer codes do require larger buffer and do introduce longer delay. But, with drastic improvements in memory technology, buffer on the order of hundreds of kilobits and its associated delay are irrelevant, particularly, for a high-speed digital video broadcast or any broadband satellite link.

While the rate 5/6 LDPC codes shown above are intended for spot-beam applications with satellite Effective Isotropic Radiated Power (EIRP) higher than traditional CONUS (Continental United States) beams, the algorithm to generate, as detailed with respect to FIG. 15, LDPC codes of any code rate and any length systematically without much compromise in performance. Good candidates for CONUS beams are rate 3/4 codes that yield 2.25 bits/symbol and rate 2/3 codes that yield 2 bits/symbol. It is noted that LDPC codes can support multiple data rates using a common decoding architecture; in contrast, convolutional codes, for example, require puncturing techniques to achieve intermediate rates.

As evident from FIG. 15, depending on the overall system link parameters, LDPC coding can achieve better power efficiency and/or bandwidth efficiency than other coding schemes, with considerably simpler decoding hardware. With properly designed LDPC codes and decoding algorithm, the decoder 305 is capable of very high-speed operation far exceeding other conventional systems with standard digital logic circuitry.

Figure 16:
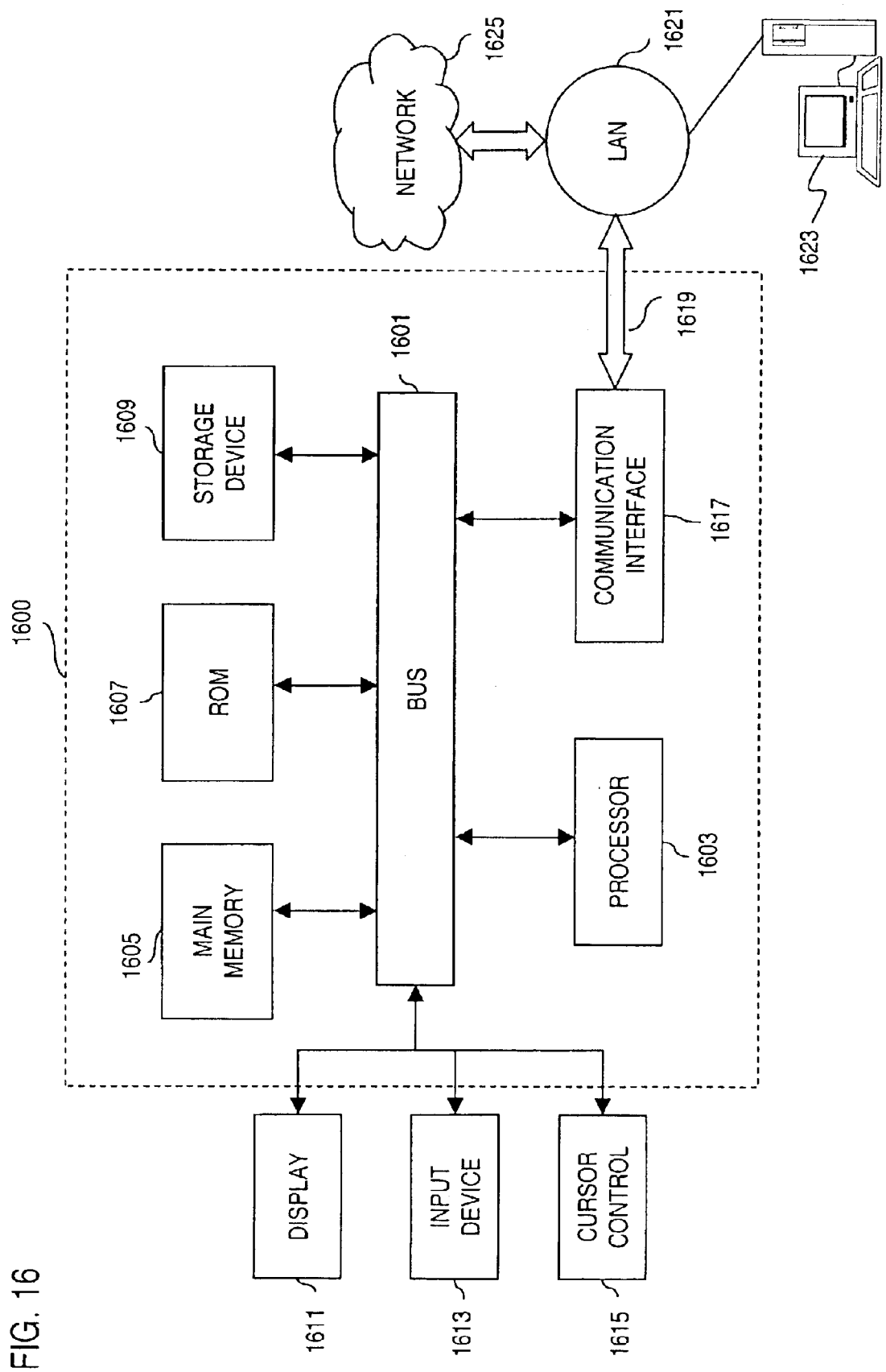
FIG. 16 is a diagram of a computer system that can perform the processes of encoding and decoding of LDPC codes, in accordance with embodiments of the present invention.

FIG. 16 illustrates a computer system 1600 upon which an embodiment according to the present invention can be implemented. The computer system 1600 includes a bus 1601 or other communication mechanism for communicating information, and a processor 1603 coupled to the bus 1601 for processing information. The computer system 1600 also includes main memory 1605, such as a random access memory (RAM) or other dynamic storage device, coupled to the bus 1601 for storing information and instructions to be executed by the processor 1603. Main memory 1605 can also be used for storing temporary variables or other intermediate information during execution of instructions to be executed by the processor 1603. The computer system 1600 further includes a read only memory (ROM) 1607 or other static storage device coupled to the bus 1601 for storing static information and instructions for the processor 1603. A storage device 1609, such as a magnetic disk or optical disk, is additionally coupled to the bus 1601 for storing information and instructions.

The computer system 1600 may be coupled via the bus 1601 to a display 1611, such as a cathode ray tube (CRT), liquid crystal display, active matrix display, or plasma display, for displaying information to a computer user. An input device 1613, such as a keyboard including alphanumeric and other keys, is coupled to the bus 1601 for communicating information and command selections to the processor 1603. Another type of user input device is cursor control 1615, such as a mouse, a trackball, or cursor direction keys for communicating direction information and command selections to the processor 1603 and for controlling cursor movement on the display 1611.

According to one embodiment of the invention, generation of LDPC codes is provided by the computer system 1600 in response to the processor 1603 executing an arrangement of instructions contained in main memory 1605. Such instructions can be read into main memory 1605 from another computer-readable medium, such as the storage device 1609. Execution of the arrangement of instructions contained in main memory 1605 causes the processor 1603 to perform the process steps described herein. One or more processors in a multi-processing arrangement may also be employed to execute the instructions contained in main memory 1605. In alternative embodiments, hard-wired circuitry may be used in place of or in combination with software instructions to implement the embodiment of the present invention. Thus, embodiments of the present invention are not limited to any specific combination of hardware circuitry and software.

The computer system 1600 also includes a communication interface 1617 coupled to bus 1601. The communication interface 1617 provides a two-way data communication coupling to a network link 1619 connected to a local network 1621. For example, the communication interface 1617 may be a digital subscriber line (DSL) card or modem, an integrated services digital network (ISDN) card, a cable modem, or a telephone modem to provide a data communication connection to a corresponding type of telephone line. As another example, communication interface 1617 may be a local area network (LAN) card (e.g. for Ethernet™ or an Asynchronous Transfer Model (ATM) network) to provide a data communication connection to a compatible LAN. Wireless links can also be implemented. In any such implementation, communication interface 1617 sends and receives electrical, electromagnetic, or optical signals that carry digital data streams representing various types of information. Further, the communication interface 1617 can include peripheral interface devices, such as a Universal Serial Bus (USB) interface, a PCMCIA (Personal Computer Memory Card International Association) interface, etc.

The network link 1619 typically provides data communication through one or more networks to other data devices. For example, the network link 1619 may provide a connection through local network 1621 to a host computer 1623, which has connectivity to a network 1625 (e.g. a wide area network (WAN) or the global packet data communication network now commonly referred to as the "Internet") or to data equipment operated by service provider. The local network 1621 and network 1625 both use electrical, electromagnetic, or optical signals to convey information and instructions. The signals through the various networks and the signals on network link 1619 and through communication interface 1617, which communicate digital data with computer system 1600, are exemplary forms of carrier waves bearing the information and instructions.

The computer system 1600 can send messages and receive data, including program code, through the network (s), network link 1619, and communication interface 1617. In the Internet example, a server (not shown) might transmit requested code belonging to an application program for implementing an embodiment of the present invention through the network 1625, local network 1621 and communication interface 1617. The processor 1603 may execute the transmitted code while being received and/or store the code in storage device 169, or other non-volatile storage for later execution. In this manner, computer system 1600 may obtain application code in the form of a carrier wave.

The term "computer-readable medium" as used herein refers to any medium that participates in providing instructions to the processor 1603 for execution. Such a medium may take many forms, including but not limited to non-volatile media, volatile media, and transmission media. Non-volatile media include, for example, optical or magnetic disks, such as storage device 1609. Volatile media include dynamic memory, such as main memory 1605. Transmission media include coaxial cables, copper wire and fiber optics, including the wires that comprise bus 1601. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Accordingly, the various embodiments of the present invention provide an approach for generating structured Low Density Parity Check (LDPC) codes, as to simplify the encoder and decoder. Structure of the LDPC codes is provided by restricting the parity check matrix to be lower triangular. Also, the approach can advantageously exploit the unequal error protecting capability of LDPC codes on transmitted bits to provide extra error protection to more vulnerable bits of high order modulation constellations (such as 8-PSK (Phase Shift Keying)). Additionally, the parity check matrix can be algorithmically generated using pre-stored constants and bitwise operations. Efficient decoding of the LDPC can be achieved by storing information representing consecutive edges from the check nodes to the bit nodes of the parity check matrix in consecutive slots of memory. The above approach advantageously yields reduced complexity without sacrificing performance.

While the present invention has been described in connection with a number of embodiments and implementations, the present invention is not so limited but covers various obvious modifications and equivalent arrangements, which fall within the purview of the appended claims.

What is claimed is:

1. A method for reliably communicating over a satellite in support of a communication service, the method comprising:
   encoding an input message to output a structured Low Density Parity Check (LDPC) coded message that provides storage of adjacent relevant edge values together in memory for concurrent memory access, wherein the adjacent relevant edge values are associated with a group of bit nodes or a group of check nodes;
   modulating the coded message according to a high order modulation scheme; and
   transmitting the modulated signal over the satellite.

2. A method according to claim 1, wherein the high order modulation scheme in the modulating step has a signal constellation representing more than four signaling points per modulation symbol, wherein some of the signaling points can be non-orthogonal to other signaling points if the signal constellation is a two-dimensional signal space.

3. A method according to claim 1, wherein the high order modulation scheme in the modulating step includes at least one of 8-PSK (Phase Shift Keying) and 16-QAM (Quadrature Amplitude Modulation).

4. A method according to claim 1, further comprising:
   applying a Reed-Solomon (RS) outer code to the input message to output the coded message.

5. A method according to claim 1, further comprising:
   demodulating the transmitted signal according to the high order modulation scheme; and
   decoding the demodulated signal according to a prescribed decoding scheme.

6. A method according to claim 5, wherein the transmitted signal is associated with one of a plurality of data rates, and the decoding step is performed according to the prescribed decoding scheme irrespective of the plurality of data rates.

7. A method according to claim 5, wherein the communication service includes direct broadcast television, the method further comprising:
   selectively outputting the decoded signal to a television display.

8. A method according to claim 5, wherein the communication service includes data service, the method further comprising:
   outputting the decoded signal to a computer.

9. A computer-readable medium bearing instructions for reliably communicating over a satellite in support of a communication service, said instruction, being arranged, upon execution, to cause one or more processors to perform the method of claim 1.

10. A satellite terminal for reliably communicating over a satellite in support of a communication service, the terminal comprising:
    an encoder configured to output a structured Low Density Parity Check (LDPC) coded message in response to an input message, the structured LDPC coded message providing storage of adjacent relevant edge values together in memory for concurrent memory access, wherein the adjacent relevant edge values are associated with a group of bit nodes or a group of check nodes; and
    modulation scheme, wherein the modulated signal is transmitted over the satellite.

11. A terminal according to claim 10, wherein the high order modulation scheme has a signal constellation representing more than four signaling points per modulation symbol, wherein some of the signaling points can be non-orthogonal to other signaling points if the signal constellation is a two-dimensional signal space.

12. A terminal according to claim 10, wherein the high order modulation scheme includes at least one of 8-PSK (Phase Shift Keying) and 16-QAM (Quadrature Amplitude Modulation).

13. A terminal according to claim 10, wherein the encoder outputs the coded message by applying a Reed-Solomon (RS) outer code to input message.

14. A terminal according to claim 10, further comprising:
    a demodulator configured to demodulate the transmitted signal according to the high order modulation scheme; and
    a decoder configured to decode the demodulated signal according to a prescribed decoding scheme.

15. A terminal according to claim 14, wherein the transmitted signal is associated with one of a plurality of data rates, and the decoding by the decoder is performed according to the prescribed decoding scheme irrespective of the plurality of data rates.

16. A terminal according to claim 14, wherein the communication service includes, and the decoded signal is output to a television display.

17. A terminal according to claim 14, wherein the communication service includes data service, and the decoded signal is output to a computer.

18. A satellite communication system supporting a communication service, the system comprising:
- a first terminal configured to encode an input message to output a structured Low Density Parity Check (LDPC) coded message that provides storage of adjacent relevant edge values together in memory for concurrent memory access, and to modulate the coded message according to a high order modulation scheme for transmission via a satellite, wherein the adjacent relevant edge values are associated with a group of bit nodes or a group of check nodes; and
- a second terminal configured to receive the transmitted signal via the satellite.

19. A system according to claim 18, wherein the high order modulation scheme has a signal constellation representing more than four signaling points per modulation symbol, wherein some of the signaling points can be non-orthogonal to other signaling points if the signal constellation is a two-dimensional signal space.

20. A system according to claim 18, wherein the high order modulation scheme includes at least one of 8-PSK (Phase Shift Keying) and 16-QAM (Quadrature Amplitude Modulation).

21. A system according to claim 18, wherein the first terminal is further configured to apply a Reed-Solomon (RS) outer code to the coded message.

22. A system according to claim 18, wherein the second terminal is configured to demodulate the transmitted signal according to the high order modulation scheme, and to decode the demodulated signal according to a prescribed decoding scheme.

23. A system according to claim 22, wherein the transmitted signal is associated with one of a plurality of data rates, and the decoding of the transmitted signal is performed according to the prescribed decoding scheme irrespective of the plurality of data rates.

24. A system according to claim 22, wherein the communication service includes direct broadcast television, and the decoded signal is output to a television display.

25. A system according to claim 22, wherein the communication service includes data service, and the decoded signal is output to a computer.

26. A system for reliably communicating over a satellite in support of a communication service, the system comprising:
- means for encoding an input message to output a structured Low Density Parity Check (LDPC) coded message that provides storage of adjacent relevant edge values together in memory for concurrent memory access, and modulating the coded message according to a high order modulation scheme that has a signal constellation representing more than two symbols per signaling point, wherein the adjacent relevant edge values are associated with a group of bit nodes or a group of check nodes; and
- a transmitter configured to propagate the modulated signal over the satellite.

27. A system according to claim 26, wherein the high order modulation scheme includes at least one of 8-PSK (Phase Shift Keying) and 16-QAM (Quadrature Amplitude Modulation).

28. A system according to claim 26, wherein the means for encoding and modulating applies a Reed-Solomon (RS) outer code to the input message to output the coded message.

29. A system according to claim 26, further comprising:
- receiver circuitry configured to demodulate the transmitted signal according to the high order modulation scheme, and to decode the demodulated signal according to a prescribed decoding scheme.

30. A system according to claim 29, wherein the transmitted signal is associated with one of a plurality of data rates, and the receiver circuitry decodes the demodulated signal according to the prescribed decoding scheme irrespective of the plurality of data rates.

31. A system according to claim 29, wherein the communication service includes direct broadcast television, the system further comprising:
- a television display configured to receive the decoded signal.

32. A system according to claim 29, wherein the communication service includes data service, the system further comprising:
- a computer configured to receive the decoded signal.

* * * * *